(12) United States Patent
Diebel

(10) Patent No.: US 9,185,813 B2
(45) Date of Patent: *Nov. 10, 2015

(54) CASE FOR PORTABLE ELECTRONIC DEVICE

(71) Applicant: Incase Designs Corp., Chino, CA (US)

(72) Inventor: Markus Diebel, San Francisco, CA (US)

(73) Assignee: Incase Designs Corp., Chino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/909,989

(22) Filed: Jun. 4, 2013

(65) Prior Publication Data

US 2013/0265703 A1   Oct. 10, 2013

Related U.S. Application Data

(63) Continuation of application No. 12/847,887, filed on Jul. 30, 2010, now Pat. No. 8,457,701, which is a continuation-in-part of application No. 29/363,974, filed on Jun. 16, 2010, now Pat. No. Des. 678,869, and a continuation-in-part of application No. 29/364,348, filed on Jun. 22, 2010, now Pat. No. Des. 623,180, and a continuation-in-part of application No. 29/364,447, filed on Jun. 23, 2010, now Pat. No. Des. 685,356.

(60) Provisional application No. 61/355,441, filed on Jun. 16, 2010, provisional application No. 61/365,302, filed on Jul. 16, 2010, provisional application No. 61/367,296, filed on Jul. 23, 2010.

(51) Int. Cl.
| | |
|---|---|
| H04M 1/00 | (2006.01) |
| H05K 5/02 | (2006.01) |
| H04B 1/3888 | (2015.01) |
| H05K 5/00 | (2006.01) |

(52) U.S. Cl.
CPC .............. *H05K 5/02* (2013.01); *H04B 1/3888* (2013.01); *H05K 5/0086* (2013.01)

(58) Field of Classification Search
CPC .. G06F 1/1626; H04B 1/3888; H04B 1/3833; H05K 5/03; H05K 5/02; H05K 5/0086; H05K 5/06; H04W 88/02
USPC ............. 455/575.1, 575.8; 379/455; 206/701; 361/679.56
See application file for complete search history.

(56) References Cited

U.S. PATENT DOCUMENTS

| | | | |
|---|---|---|---|
| 4,515,272 | A | 5/1985 | Newhouse |
| D284,372 | S | 6/1986 | Carpenter |
| D312,534 | S | 12/1990 | Nelson et al. |
| D322,719 | S | 12/1991 | Jayez |

(Continued)

OTHER PUBLICATIONS

"Cheap DIY iPhone External Battery," Michael Fisher's Web Log, Jul. 22, 2008, available at <http://fastdad.wordpress.com/2008/07/22/cheap-diy-iphone-external-battery/>, retrieved May 12, 2009, 10 pages.

(Continued)

*Primary Examiner* — Allahyar Kasraian
(74) *Attorney, Agent, or Firm* — Aka Chan LLP

(57) ABSTRACT

A case for an electronic device protects the electronic device. The case has a lower case portion and an upper case portion, which assemble together to protect the electronic device. A back of the case can include a back opening to expose a camera lens and flash of the electronic device or first and second back openings. The first back opening exposes the camera lens. The second back opening exposes the flash.

22 Claims, 16 Drawing Sheets

(56) References Cited

U.S. PATENT DOCUMENTS

| | | | |
|---|---|---|---|
| 5,360,108 A | 11/1994 | Alagia |
| 5,368,159 A | 11/1994 | Doria |
| 5,383,091 A | 1/1995 | Snell |
| D357,918 S | 5/1995 | Doria |
| D372,896 S | 8/1996 | Nagele et al. |
| 5,586,002 A | 12/1996 | Notarianni |
| 5,604,050 A | 2/1997 | Brunette et al. |
| 5,610,979 A | 3/1997 | Yu |
| 5,708,707 A | 1/1998 | Halttunen et al. |
| 5,711,013 A | 1/1998 | Collett et al. |
| D392,248 S | 3/1998 | Johansson |
| D392,939 S | 3/1998 | Finke-Anlauff |
| D400,495 S | 11/1998 | Deslyper et al. |
| 5,864,766 A | 1/1999 | Chiang |
| D405,801 S | 2/1999 | Nagele et al. |
| 5,896,277 A | 4/1999 | Leon et al. |
| 6,043,626 A | 3/2000 | Snyder et al. |
| 6,184,654 B1 | 2/2001 | Bachner, III et al. |
| 6,201,867 B1 | 3/2001 | Koike |
| 6,317,313 B1 | 11/2001 | Mosgrove et al. |
| 6,324,380 B1 | 11/2001 | Kiuchi et al. |
| D460,411 S | 7/2002 | Wang |
| D469,427 S | 1/2003 | Ma et al. |
| 6,538,413 B1 | 3/2003 | Beard et al. |
| 6,555,990 B1 | 4/2003 | Yang |
| 6,614,722 B2 | 9/2003 | Polany et al. |
| 6,626,362 B1 | 9/2003 | Steiner et al. |
| D484,874 S | 1/2004 | Chang et al. |
| D506,612 S | 6/2005 | Rosa et al. |
| 6,992,461 B2 | 1/2006 | Liang et al. |
| 7,050,841 B1 | 5/2006 | Onda |
| 7,166,987 B2 | 1/2007 | Lee et al. |
| D537,063 S | 2/2007 | Kim et al. |
| 7,194,291 B2 | 3/2007 | Peng |
| D540,539 S | 4/2007 | Gutierrez |
| D543,541 S | 5/2007 | Chung et al. |
| D547,056 S | 7/2007 | Griffin et al. |
| D547,057 S | 7/2007 | Griffin et al. |
| D551,252 S | 9/2007 | Andre et al. |
| D551,856 S | 10/2007 | Ko et al. |
| D556,681 S | 12/2007 | Kim |
| D557,205 S | 12/2007 | Kim |
| D558,972 S | 1/2008 | Oh |
| D558,973 S | 1/2008 | Hussaini et al. |
| D561,092 S | 2/2008 | Kim |
| D563,093 S | 3/2008 | Nussberger |
| 7,400,917 B2 | 7/2008 | Wood et al. |
| D574,819 S | 8/2008 | Andre et al. |
| D575,056 S | 8/2008 | Tan |
| 7,428,427 B2 | 9/2008 | Brunstrom et al. |
| D581,151 S | 11/2008 | Aipa |
| D582,149 S | 12/2008 | Tan |
| 7,479,759 B2 | 1/2009 | Vilanov et al. |
| D587,896 S | 3/2009 | Aipa |
| D597,089 S | 7/2009 | Khan et al. |
| D603,603 S | 11/2009 | Laine et al. |
| 7,612,997 B1 | 11/2009 | Diebel et al. |
| D606,529 S | 12/2009 | Ferrari et al. |
| D609,228 S | 2/2010 | Ferrari et al. |
| D609,463 S | 2/2010 | Bullen |
| D610,807 S | 3/2010 | Bau |
| D611,042 S | 3/2010 | Ferrari et al. |
| D617,787 S | 6/2010 | Richardson et al. |
| 8,028,794 B1 | 10/2011 | Freeman |
| 2002/0147035 A1 | 10/2002 | Su |
| 2003/0096642 A1 | 5/2003 | Bessa et al. |
| 2003/0218445 A1 | 11/2003 | Behar |
| 2004/0097256 A1 | 5/2004 | Kujawski |
| 2005/0090301 A1 | 4/2005 | Lange et al. |
| 2005/0231159 A1 | 10/2005 | Jones et al. |
| 2005/0248312 A1 | 11/2005 | Cao et al. |
| 2006/0058073 A1 | 3/2006 | Kim |
| 2006/0099999 A1 | 5/2006 | Park |
| 2007/0099680 A1* | 5/2007 | Kielland ............... 455/575.1 |
| 2007/0152633 A1 | 7/2007 | Lee |
| 2007/0167190 A1 | 7/2007 | Moosavi et al. |
| 2007/0236180 A1 | 10/2007 | Rodgers |
| 2008/0007214 A1 | 1/2008 | Cheng |
| 2008/0096620 A1 | 4/2008 | Lee et al. |
| 2008/0108395 A1 | 5/2008 | Lee et al. |
| 2008/0123287 A1 | 5/2008 | Rossell et al. |
| 2008/0132289 A1 | 6/2008 | Wood et al. |
| 2009/0017883 A1 | 1/2009 | Lin |
| 2009/0111543 A1 | 4/2009 | Tai et al. |
| 2009/0205983 A1 | 8/2009 | Estlander |
| 2010/0007773 A1 | 1/2010 | O'Connell et al. |
| 2010/0048267 A1 | 2/2010 | Lin |
| 2010/0093412 A1 | 4/2010 | Serra et al. |
| 2010/0200456 A1 | 8/2010 | Parkinson |
| 2011/0034221 A1 | 2/2011 | Hung |
| 2011/0049005 A1 | 3/2011 | Wilson |
| 2011/0136555 A1 | 6/2011 | Ramies et al. |
| 2011/0157297 A1 | 6/2011 | O'Connell |
| 2011/0297578 A1 | 12/2011 | Stiehl |
| 2013/0213856 A1* | 8/2013 | Ho ............................ 206/775 |

OTHER PUBLICATIONS

Rees, Dave, "Richard Solo Backup Battery for iPhone/iPod Review," Gadgeteer, Jun. 16, 2008, available at <http://the-gadgeteer.com/2008/06/16/richard_solo_backup_battery_for_iphone_ipod/>, retrieved May 12, 2009, 8 pages.

Horowitz, Jeremy, "Kensington Mini Battery Pack and Charger for iPhone and iPod," iLounge, May 16, 2008, available at <http://www.ilounge.com/index.php/reviews/entry/kensington-mini-battery-pack-and-charger-for-iphone-and-ipod/>, retrieved May 12, 2009, 3 pages.

"Mini Battery Pack and Charger for iPhone and iPod," Kensington, May 1, 2008, available at <http://files.acco.com/KENSINGTON/K33442US/K33442US-usconsumer.pdf>, retrieved May 12, 2009, 1 page.

Rafferty, Sven, "Mybat External Battery for iPhone and iPod," SvenOnTech, May 18, 2008, available at <http://svenontech.com/reviews/?p=74>, retrieved May 12, 2009, 4 pages.

Coldewey, Devin, "Combination iPhone Battery Pack and Flash From FastMac," CrunchGear, Nov. 4, 2008, available at <http://www.crunchgear.com/2008/11/04/combination-iphone-battery-pack-and-flash-from-fastmac/>, retrieved May 12, 2009, 3 pages.

Horowitz, Jeremy, "iLuvi603/1604 Rechargeable Lithium Polymer Batteries with Silicone Skin," iLounge, Jun. 27, 2006, available at <http://www.ilounge.com/index.php/reviews/entry/iluv-i603-rechargeable-lithium-polymer-battery-with-silicone-skin>, retrieved May 12, 2009, 3 pages.

Seidio, Inc., Innocase for iPhone, available at http://www.seidioonline.com, Jan. 2008 (accessed Feb. 6, 2008).

Review of BoxWave FlexiSkin for Apple iPhone, available at http://www.ilounge.conn, Jul. 6, 2007 (accessed Feb. 6, 2008).

Review of DLO Jam Jacket for iPhone, available at http://www.ilounge.com, Jul. 6, 2007 (accessed Feb. 6, 2008).

Review of Incipio dermaSHOT Silicone Case for Apple iPhone, available at http://www.ilounge.com, Jul. 6, 2007 (accessed Feb. 6, 2008).

Review of Marware SportGrip Smooth Silicone Protection for iPhone, available at http://www.ilounge.com, Jul. 6, 2007 (accessed Feb. 6, 2008).

Review of Speck Skinlight 2-Pack for iPhone, available at http://www.ilounge.com, Jul. 6, 2007 (accessed Feb. 6, 2008).

Review of Speck ToughSkin for iPhone, available at http://www.ilounge.com, Jul. 6, 2007 (accessed Feb. 6, 2008).

Review of Belkin Acrylic Case for iPhone, available at http://www.ilounge.com, Jul. 7, 2007 (accessed Feb. 6, 2008).

Review of Belkin Sport Armband for iPhone, available at http://www.ilounge.com, Jul. 19, 2007 (accessed Feb. 6, 2008).

iSkin, Inc., revo for iPhone, available at http://www.iskin.com, announced Jul. 25, 2007 (accessed Feb. 6, 2008).

The Agent 18 Eco iPhone Shield Case Review, available at http://blog.monkeykit.com, Sep. 14, 2007 (accessed Feb. 6, 2008).

Review of Artwizz SeeJacket Crystal for Apple iPhone, available at http://www.ilounge.com, Nov. 29, 2007 (accessed Feb. 6, 2008).

Review of Agent 18 iPhone Shield, available at http://www.ilounge.com, Jan. 4, 2008 (accessed Feb. 6, 2008).

(56) References Cited

OTHER PUBLICATIONS

Review of Belkin Clear Case for iPhone, available at http://www.ilounge.com, Jan. 4, 2008 (accessed Feb. 6, 2008).
Review of CoverCase SlimSkin Silicon Case for iPhone, available at http://www.ilounge.com, Jan. 10, 2008 (accessed Feb. 6, 2008).
Agent 18, Eco iPhone Shield, available at http://www.agent18.com, Sep. 2007 (accessed Feb. 6, 2008).
Agent 18, iPhone Shield, available at http://www.agent18.com, Dec. 2007 (accessed Feb. 6, 2008).
Seidio, Inc., Super Slim Rubberized Hard Case for iPhone, available at http://www.seidioonline.com, Sep. 2007 (accessed Feb. 6, 2008).
Mophie Juice Pack iPhone 1G Product Reference, May 1, 2008, 22 pages.
Mophie Juice Pack iPhone 3G Product Reference, Aug. 4, 2008, 33 pages.

* cited by examiner

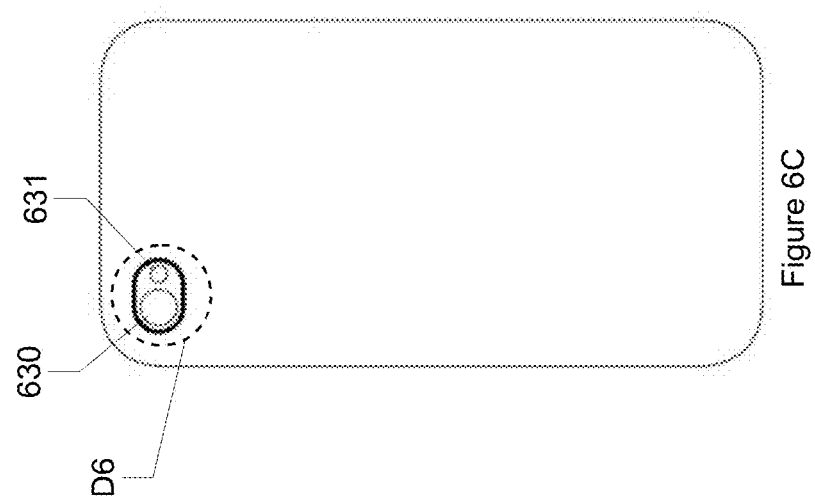
Figure 6C
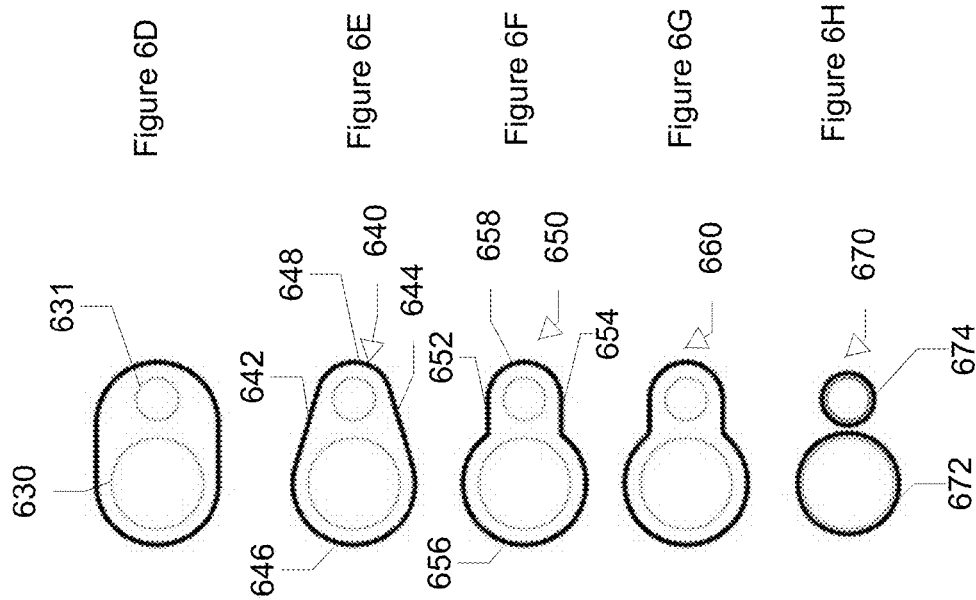
Figure 6D
Figure 6E
Figure 6F
Figure 6G
Figure 6H

CASE FOR PORTABLE ELECTRONIC DEVICE

CROSS-REFERENCE TO RELATED APPLICATIONS

This patent application is a continuation of U.S. patent application Ser. No. 12/847,887, filed Jul. 30, 2010, issued as U.S. Pat. No. 8,457,701 on Jun. 4, 2013, which claims the benefit of U.S. provisional applications 61/355,441, filed Jun. 16, 2010, and 61/365,302, filed Jul. 16, 2010; 61/367,296, filed Jul. 23, 2010, and is a continuation-in-part of U.S. patent applications Ser. No. 29/363,974, filed Jun. 16, 2010; Ser. No. 29/364,348, filed Jun. 22, 2010; and Ser. No. 29/364,447, filed Jun. 23, 2010. These applications are incorporated by reference along with all other references cited in this application.

BACKGROUND OF THE INVENTION

This invention relates to a case for portable electronic devices. There are many types of portable electronic devices including personal digital assistants (PDAs), computers, smartphones, mobile phones, satellite phones, cellular phones, pagers, music player, MP3 players, media players, digital cameras, video cameras, bar code scanner, global positioning system (GPS), and portable game consoles.

These portable electronic devices allow people to play and record music, send and receive e-mail, send text messages, browse Web pages, make phone calls, play and record video, take and view pictures, edit documents, and much more. These devices continue to revolutionize the way people interact, learn, connect with other people, conduct business, and find things. They help people manage their daily lives and can be a source of entertainment. These devices can be used to store valuable information including personal information (e.g., phone numbers, financial information, private photos or videos, and favorite music tracks).

Typically these devices are intended to be carried or moved about. As such, these devices are more vulnerable to damage as compared to nonportable devices. These devices are more likely to be accidentally dropped, hit, or scratched. Some types of damage may be cosmetic (e.g., scratch). However, other types of damage may ruin or limit the functionality of the device. Often these devices contain sensitive and fragile components (e.g., screen, camera lens, flash, processors, accelerometers, and sensors). Accidentally dropping the device could render various features unusable.

Therefore, it is desirable to protect the electronic device while still allowing features of the device to be easily accessed.

BRIEF SUMMARY OF THE INVENTION

A case for an electronic device protects the electronic device. The case has a lower case portion and an upper case portion, which assemble together to protect the electronic device. A back of the case can include a back opening to expose a camera lens and flash of the electronic device or first and second back openings. The first back opening exposes the camera lens. The second back opening exposes the flash.

In a specific implementation, a case for a portable electronic device includes a top part and a bottom part. The top and bottom parts join together to form a horizontal part line. The top part has first and second combined access holes. The first combined access hole is on a back of the top part. The second combined access hole is on a side of the top part. The first combined access hole is for a camera lens and flash of the electronic device. The second combined access hole is for volume and ringer controls of the electronic device. The top and bottom parts further included a protective spine on an inside or interior surface of the top and bottom parts. The protective spine helps to protect the electronic device from scratches, provides shock absorption, and ensures a tight and secure fit. In a specific implementation, the protective spines include overmolded thermoplastic elastomers (TPE).

The bottom part includes a third combined access hole on a lower sidewall, an overlap, and a part line. The third combined access hole allows access to a 30-pin connector and keeps the speaker holes of the electronic device open. The overlap can keep the case together without the electronic device being encased within the case. The overlap can also create a secure connection between the two parts (top and bottom parts) when the portable electronic device is loaded. The part line aligns with a bottom edge of the display of the electronic device. The bottom part can come off (i.e., can be removed from the top part), for loading and unloading. Removal of the bottom part can allow for docking without removing the top part.

In this specific implementation, the top and bottom parts of the case are made of polycarbonate (PC). In a specific implementation, the case is designed for the Apple iPhone 4.

In a specific implementation, a case for an electronic device includes a first case portion including a first back sidewall, where the first back sidewall includes a top edge, and a lower sidewall, connected to the first back sidewall at an end opposite of the top edge, that will be positioned against a bottom side edge of the electronic device. A second case portion includes an upper sidewall that will be positioned against a top side edge of the electronic device when the second case portion is seated against the first case portion, and an open side end, opposite the upper sidewall, where the second case portion slides onto the first case portion through the open side end.

There is a back opening, through a back of the case, including a length and a width, where the length of the back opening is greater than the width of the back opening. When the second case portion is seated against the first case portion, the first and second case portions meet at and form a seam which extends across the back of the case, and a first open-shaped opening for the first case portion merges with a second open-shaped opening for the second case portion to form a front opening of the case through which a screen of the electronic device will be visible, the front opening having a closed shape. The length of the back opening may be at least about 12, 13, or 15 millimeters.

In an implementation, first and second seam lines of the seam are visible from a front of the case. The first seam line being on one side of the front opening, and the second seam line being on an opposite side of the front opening. The first seam line may be at one end of a bottom edge of the screen and the second seam line may be at an opposite end of the bottom edge of the screen.

In a specific implementation, the first case portion includes the back opening. In another specific implementation, the second case portion includes the back opening. A distance from the seam to the back opening may be greater than a distance from the seam to the lower sidewall. A distance from the seam to the back opening may be less than a distance from the seam to the lower sidewall.

In a specific implementation, a first seam line of the seam extending across the back of the case is straight. In another implementation, the first seam line is curved.

A shape of the back opening may be an oval having the length and the width. A difference between the length and the width may be at least about 3, 4, or 6 millimeters.

In an implementation, each of the first and second case portions includes a left sidewall, and a right sidewall, opposite the left sidewall. The left and right sidewalls are flat. The back of the case may be flat. In a specific implementation, the case includes a bottom opening through the lower sidewall, where a shape of the bottom opening is a rectangle.

In a specific implementation, the case includes a left-hand sidewall connected to a second back sidewall of the second case portion, a side opening through the left-hand sidewall, and a cover, where the cover at least partially covers the side opening.

In a specific implementation, a case for an electronic device includes a first case portion including a first back sidewall, where the first back sidewall includes a top edge, and a lower sidewall, connected to the first back sidewall at an end opposite of the top edge, that will be positioned against a bottom side edge of the electronic device. A second case portion includes an upper sidewall that will be positioned against a top side edge of the electronic device when the second case portion is seated against the first case portion, and an open side end, opposite the upper sidewall, where the second case portion slides onto the first case portion through the open side end. There is an oval opening, through a back of the case, including a length and a width. The length of the oval opening is greater than the width of the oval opening, and the oval opening makes visible a camera lens and flash of the electronic device, When the second case portion is seated against the first case portion, the first and second case portions meet at and form a seam which extends across the back of the case, and a first open-shaped opening for the first case portion merges with a second open-shaped opening for the second case portion to form a front opening of the case through which a screen of the electronic device will be visible, the front opening having a closed shape.

In a specific implementation, the first case portion includes the oval opening. In another specific implementation, the second case portion includes the oval opening.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 6C shows a back view of a back of a case.

FIG. 6D shows a first embodiment for a back opening of the case shown in FIG. 6C.

FIG. 6E shows a second embodiment for a back opening of the case shown in FIG. 6C.

FIG. 6F shows a third embodiment for a back opening of the case shown in FIG. 6C.

FIG. 6G shows a fourth embodiment for a back opening of the case shown in FIG. 6C.

FIG. 6H shows a fifth embodiment for a back opening of the case shown in FIG. 6C.

DETAILED DESCRIPTION OF THE INVENTION

Figure 1:
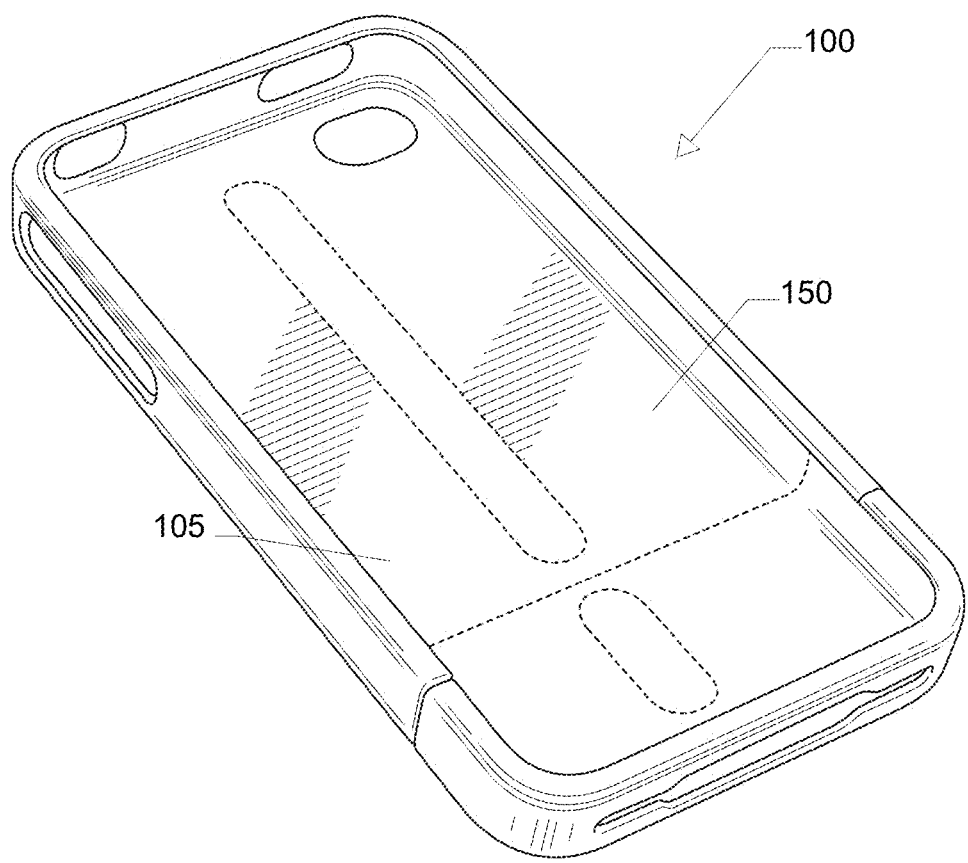
FIG. 1 shows a perspective view of a front of a case in an assembled position.

FIG. 1 shows a perspective view of a front of a case 100. This case can be used to protect a portable electronic device, such as a smartphone (FIG. 3), from damage. The case includes a cavity 105 which holds the portable electronic device. The case may include one or more openings so that a user can access the various features, controls, buttons, switches, dials, knobs, and ports of the electronic device (e.g., touch screen, camera lens, camera flash, power button, headphone jack, and the like) while the electronic device is encased within the case.

Figure 2:
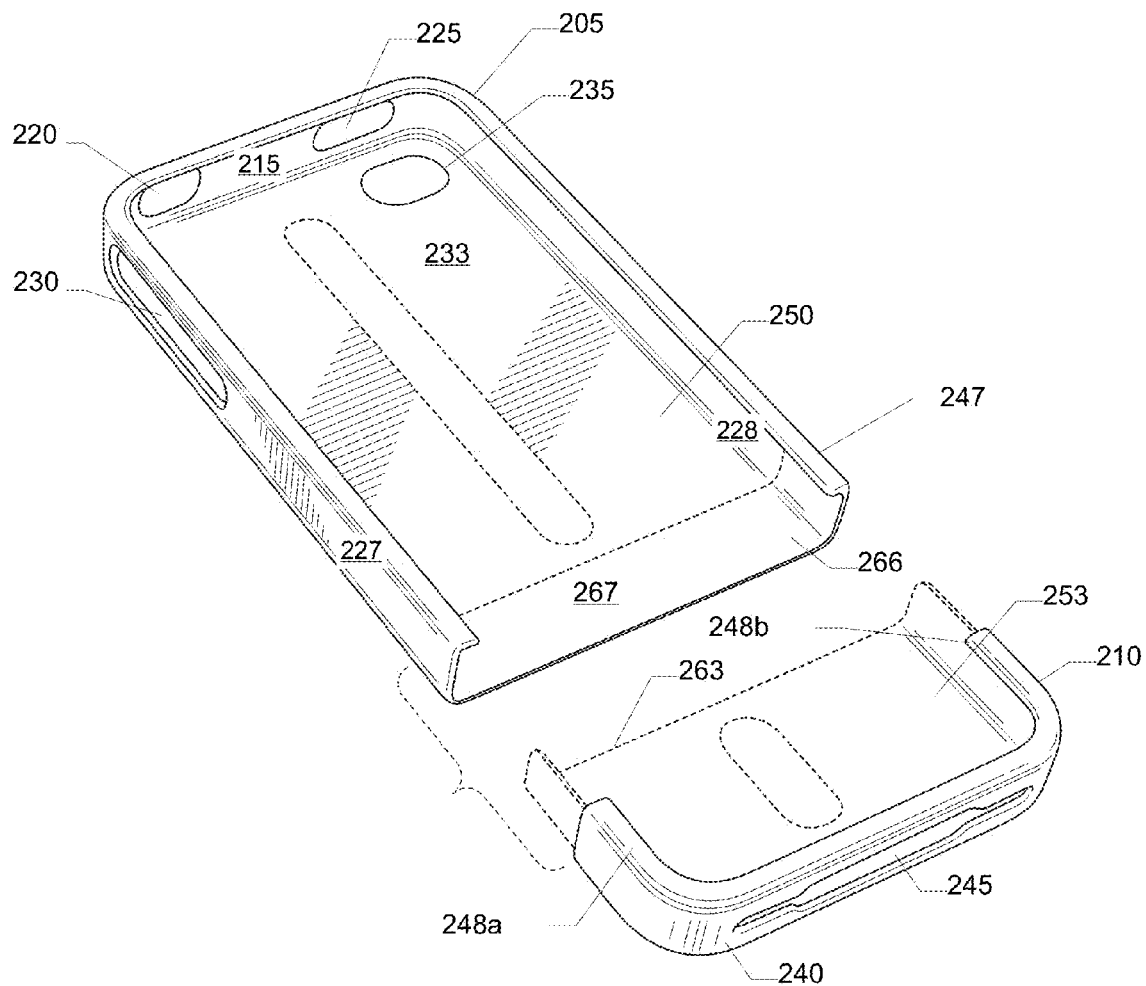
FIG. 2 shows a perspective view of the front of the case in a disassembled position.
Figure 4:
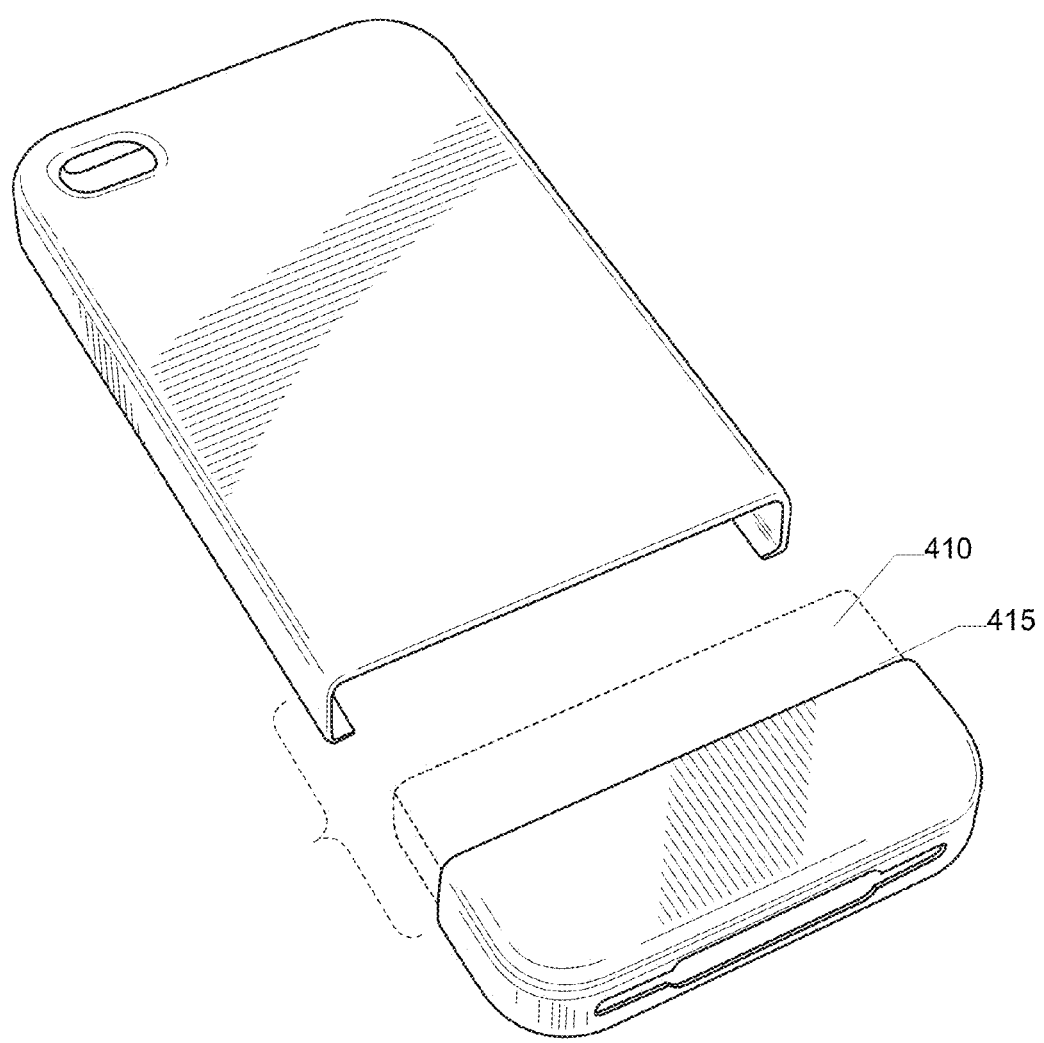
FIG. 4 shows a perspective view of a back of the case in the disassembled position.
Figure 5:
FIG. 5 shows a perspective view of a back of the case in the assembled position.

FIGS. 2 and 4-5 show various perspective views of the case. FIG. 2 shows a front of the case in a disassembled position or state. FIG. 4 shows a back of the case in the disassembled position. FIG. 5 shows a back of the case in an assembled position. Referring now to FIG. 2, the case includes an upper case portion 205 and a lower case portion 210. This figure shows the case in a portrait mode orientation. However, the orientation of the case may change (e.g., landscape mode orientation or upside-down orientation) or vary depending on the point of view or the orientation of the electronic device. So, the lower case portion may become the upper case portion, right-side case portion, or left-side case portion. The upper case portion may become the lower case portion, right-side case portion, or left-side case portion. Regardless of the orientation, the case has two portions. The lower case portion may also be referred to as a first case portion (or bottom part) and the upper case portion may be referred to as a second case portion (or top part). Alternatively, the upper case portion may be referred to as a first case portion and the lower case portion may be referred to as a second case portion.

The portable electronic device fits into the lower case portion. The upper case portion slides over the portable electronic device and lower case portion to secure the portable electronic device in place. The lower case portion can come off for loading and unloading (i.e., loading or placing the portable electronic device into the case and unloading or removing the portable electronic device from the case). Removal of the lower case portion allows for docking the portable electronic device without removing the upper case portion.

Specifically, as shown in FIGS. 2 and 4, like a sleeve, the upper case portion slides over and onto the insert or extension 410 (FIG. 4) of the lower case portion until being stopped by a raised lip or shoulder 415 of the lower case portion. This raised lip extends from the left-hand side of the front of the case (FIG. 2), along the back (FIG. 4), to the right-hand side of the front of the case (FIG. 2). Where the upper and lower case portions meet, the exterior surfaces become flush with each other.

When the upper case portion is seated against the lower case portion, on a back side of the case, the upper case portion or sleeve 267 overlaps at least one portion of the lower case portion (e.g., insert 410) to hold the upper case to the lower case portion.

The upper case portion generally holds onto the insert of the lower case portion through friction. Further, a distance from a left-hand side outer surface of the insert to a right-hand side outer surface of the insert can be typically slightly greater than an inner width of the upper case portion sleeve or open side end 266 of the upper case portion (i.e., into which the insert will fit). This allows the upper case portion to hold onto the insert by compression. As shown in FIG. 1, once joined, sidewalls for the upper and lower case portions form front opening 150, which is generally a rectangular frame with rounded corners.

Features and aspects of this case may be applied to cases for various portable electronic devices and device types. In a specific implementation, the portable electronic device to be protected is a smartphone. For purposes of discussion, this patent application describes the case as being for a smartphone. Some examples of smartphones include the Apple® iPhone, Blackberry® Storm, Blackberry® Pearl, Samsung® Blackjack, LG®, Touch phones, and LG®, Dare, and there are many others.

However, the case can be used with any type of battery-powered portable electronic device, where this device does not necessarily provide telephony functionality. For example, in other implementations, the case may be for a portable or handheld gaming device (e.g., Sony® PlayStation® Portable or PSP®, or Nintendo® DS™), portable or palm-sized computer (e.g., OQO computer or Intel® Atom™ netbook), personal digital assistant (PDA), pager, audio player, video player, media player (Apple® Touch), cassette player, compact disc (CD) player, digital video disc (DVD) player, camera, video recorder, digital recorder, voice recorder, music recorder, digital audio recorder, or nonvolatile memory storage (e.g., Flash or phase-change memory).

Trademarks are the property of their respective owners. Apple is a trademark of Apple Computer Incorporated. Blackberry is a trademark of Research in Motion Limited. Samsung is a trademark of Samsung Electronics Company Limited. LG is a trademark of LG Electronics, Incorporated. Sony is a trademark of Sony Corporation. PlayStation and PSP are trademarks of Sony Computer Entertainment Incorporated. Nintendo is a trademark of Nintendo Company, Limited. Intel and Atom are trademarks of Intel Corporation. OQO is a trademark of OQO Incorporated.

Figure 3:
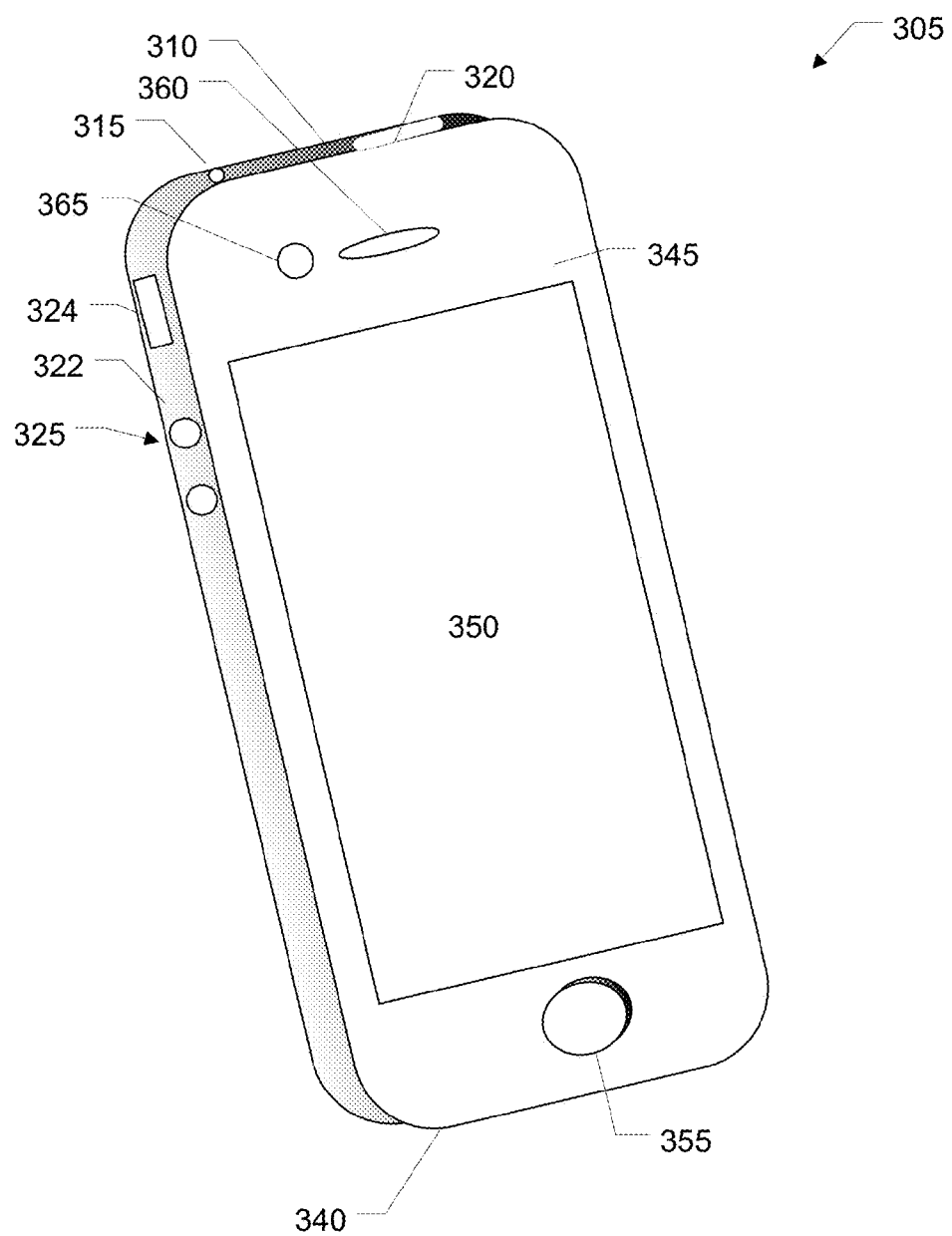
FIG. 3 shows an example of a portable electronic device.

FIG. 3 shows a representative portable electronic device 305. This portable electronic device is a smartphone (e.g., Apple iPhone 4). The smartphone has a top side edge 310 where there is a headset jack 315 and a sleep/wake or on/off button 320. On a left side edge 322, there is a ring/silent switch 324 and volume buttons 325. On a back of the device (not shown in FIG. 3), there is a first camera lens and a camera flash.

On a bottom side edge 340 of the device, there are speaker and microphone openings (not shown) and an electrical connector (not shown). Via the electrical connector, the phone can be charged or connected to another device, such as a computer or another smartphone, for synchronizing or transferring of files.

On a front 345 of the device, there is a screen 350, which may be a touch screen. Below the touch screen, there is a button 355, and above the touch screen, a telephone receiver 360 (which a user can hold to an ear to hear a telephone conversation), and a second camera lens 365.

While the device is in the case, the user will still be able to access the features of the device. Specifically, for example, as shown in FIG. 2, for accessing the headset jack and sleep/wake button, the upper case portion has on a top side or upper sidewall 215, a headset jack opening 220 and a sleep/wake button opening 225. For accessing the ring/silent switch and volume buttons, the upper case portion has on a left side, left (or first) sidewall 227, a side opening 230. First sidewall 227 is opposite a second sidewall 228. For the first camera lens and flash, the upper case portion has on a back sidewall, back wall, or base 233 a camera lens and flash opening 235. This opening may be referred to as a back opening. For accessing the microphone, speaker, and electrical connector of the smartphone, the lower case portion has on a lower sidewall 240, opposite a top edge 263, a bottom opening 245.

As shown in FIG. 1, when assembled together, the upper and lower portions of the case define an opening 150 in the front, through which the user can view and access the touch screen, home button, second camera lens, and receiver. Frame edges 247 surround or at least partially surround front opening 150 to hold the portable electronic device in the case. As shown in the figure, opening 150 has a closed-polygon shape.

The closed-polygon shape can have any shape (e.g., square, trapezoid, pentagon, hexagon, octagon, star, circle, arc, or oval). In a specific implementation, the closed-polygon shape is a rectangle with rounded corners. This closed-polygon shape is formed by the merging of two open-polygon shapes. For example, as shown in FIG. 2, the upper case portion has a first open-polygon front opening 250; this shape may generally be described as an upside down U. The lower case portion has a second open-polygon front opening 253; this shape may generally be described as a U. To assemble the case together, the upper case portion is seated or fitted against the lower case portion. Then the upside-down U of the upper case portion joins with the U of the lower case portion to form the rectangular closed-polygon-shaped front opening shown in FIG. 1.

An opening may be referred to as an access hole, a combined access hole, or a slot. An opening can have any shape. For example, a shape of an opening may be a circle, semicircle, square, square with rounded corners, rectangle, rectangle with rounded corners, oval, ellipse, triangle, obround (e.g., a shape having two semicircles connected by parallel lines tangent to their endpoints), crescent, pentagon, hexagon, simple polygon, and so forth. An opening may have a closed-shape or figure such as back opening 235 (FIG. 2). An opening may have an open-shape or figure such as first and second open-polygon front openings 250 and 253. An open-shaped opening may be combined with or merged with another open-shaped opening to form a closed opening such as the rectangular closed-polygon-shaped front opening shown in FIG. 1.

Figure 6A:
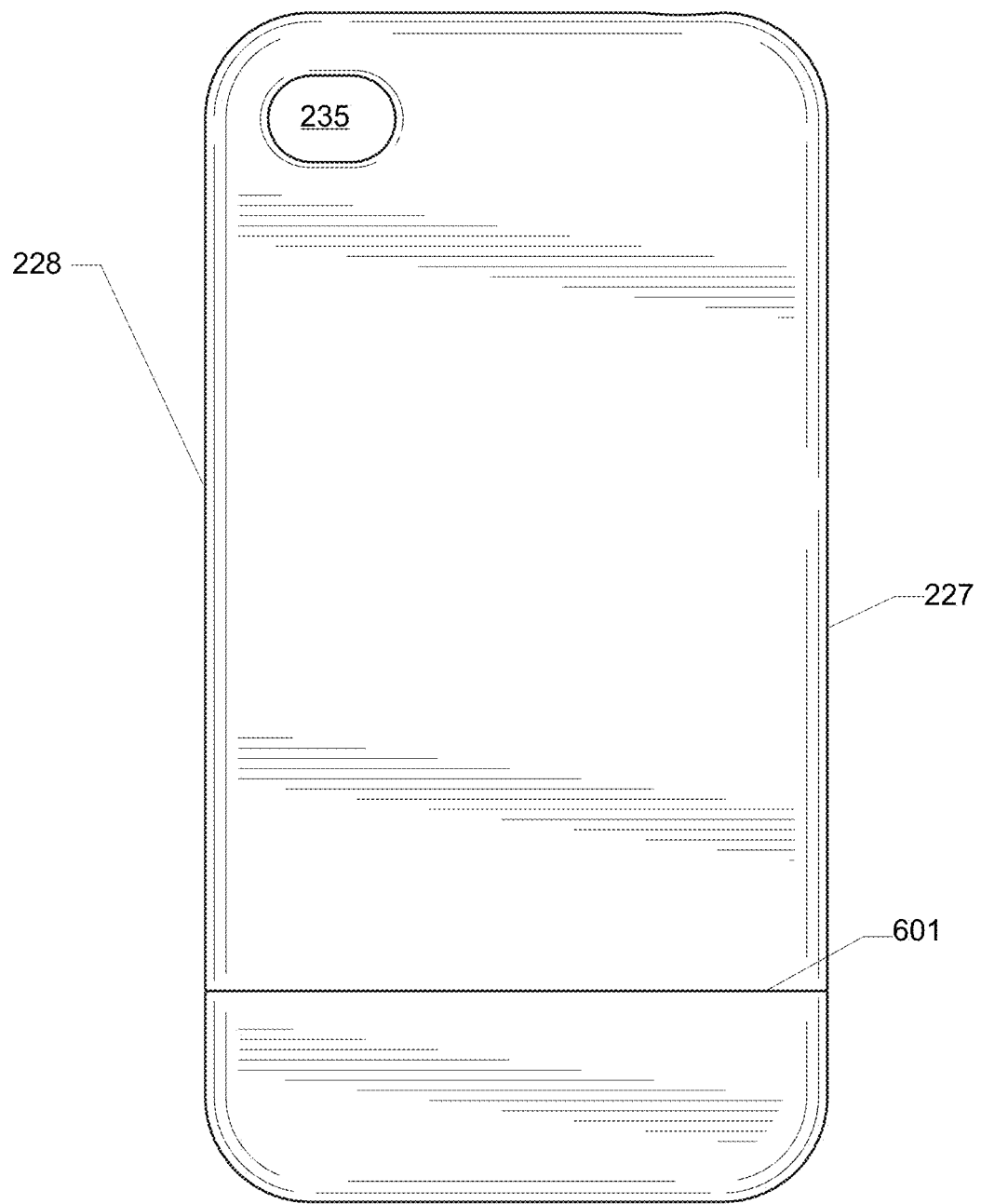
FIG. 6A shows a back view of a back of the case having a back opening in the shape of an oval.

FIG. 6A shows a back of the case showing back opening 235 and a seam 601 extending across the back of the case. The back opening, when viewed from the back of the case, is located in the upper left-hand corner of the case. Alternatively, the case may be reoriented or flipped lengthwise so that a user is viewing a front of the case. From this perspective, the back opening will be located in the upper right-hand corner of the case. The case may be oriented so that the back opening is located in the lower right-hand or lower left-hand corner of the case.

In this specific implementation, the back opening is formed as a single opening where the single opening exposes a camera lens 630 (FIG. 6C) and flash 631 of the electronic device. When the case is placed on the portable electronic device, this back opening exposes, makes accessible, or makes visible a camera lens and camera flash of the electronic device. The smartphone's camera lens and flash aligns behind the back opening so that the camera lens' view and flash is unobstructed. A picture taken with the smartphone in the case will not capture the sides or edges of the camera openings.

For some portable electronic devices or smartphones, the camera lens and flash of the smartphone are located relatively close to each other. Forming the back opening as a single large opening as compared to forming two small openings, each opening aligning with one of the camera lens or flash, has several benefits. One benefit is that the camera lens' view will be less likely to be obstructed because there is no case material between the camera lens and the flash. Thus, a picture taken with the smartphone in the case will not capture case material between the camera lens and flash because there is no case material to capture.

Another benefit is that the light from the flash will be less likely to be obstructed because there is no case material between the camera lens and the flash. Camera subjects can be clearly illuminated by the flash because there is no case material between the camera lens and the flash to block light from the flash. This can help to produce pictures where the picture subjects are clearly illuminated with all physical features generally shown and without unwanted shadows. By not blocking light from the flash, the single large back opening feature can help facilitate taking good pictures—especially where ambient light is inadequate (e.g., taking pictures indoors such as at an indoor party, taking pictures at night, taking pictures on a cloudy day, and so forth).

Figure 6B:
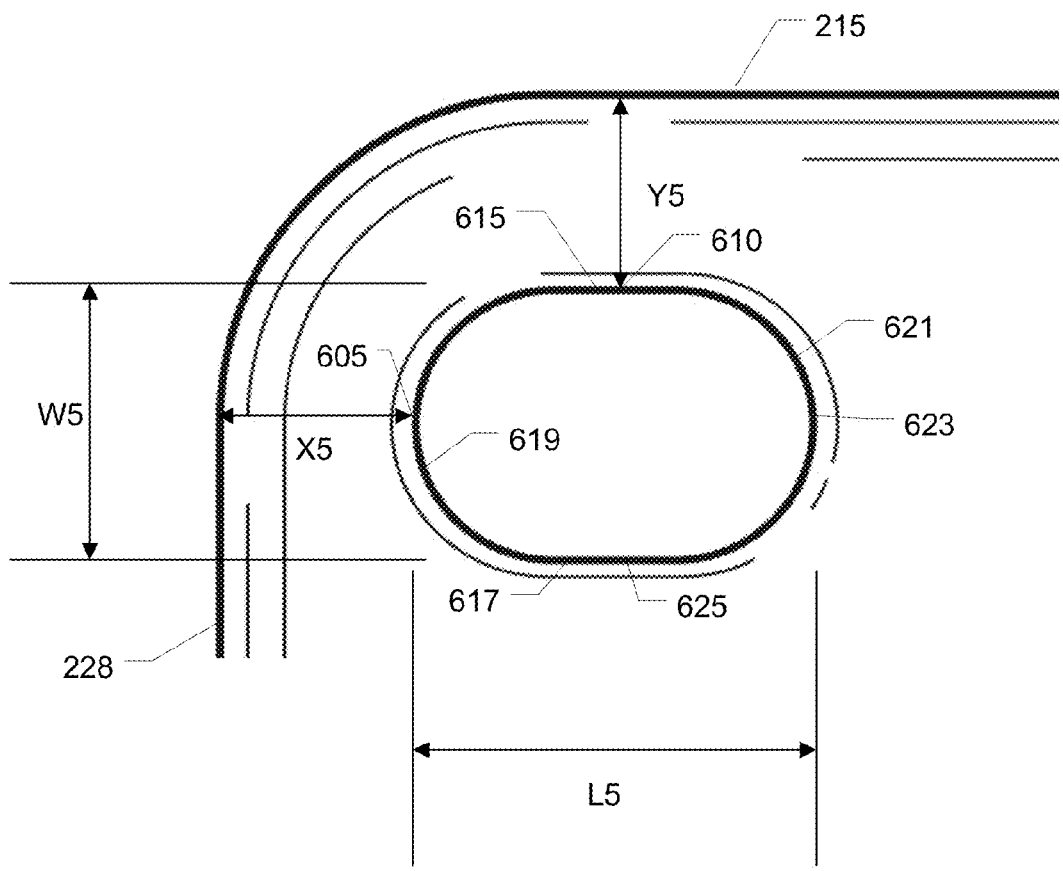
FIG. 6B shows an enlarged view of the back opening shown in FIG. 6A.

FIG. 6B shows an enlarged detail view of a back portion of the case shown in FIG. 6A. A first dimension or length L5 indicates a length of the back opening. A second dimension or width W5 indicates a width of the back opening. The opening edge also has a bevel or slope with respect to the back surface (or with respect the back of an electronic device that is inserted in the case). In a specific implementation L5 is greater than W5. A direction of W5 is transverse to a direction of L5. Also note that the orientation of L5 is transverse to a longest dimension of the front opening of case. In a specific implementation, length L5 is about 13 millimeters and width W5 is about 9 millimeters. In another specific implementation, length L5 is about 15 millimeters and width W5 is about 9 millimeters.

In a specific implementation, the edging of the camera-flash opening has a 0-degree slope, which means the edging is transverse or perpendicular to the back surface (and also camera lens). However in other implementations, the slope is greater than 0 degrees, so that the opening has a concave edging (when viewed from the outside of the back side of the case).

A distance X5 indicates a distance between second sidewall 228 and a first point 605 of the back opening nearest the second sidewall. A distance Y5 indicates a distance between upper sidewall 215 and a second point 610 of the back opening nearest the upper sidewall. A shape or outline of the back opening is defined by a first line 615, a second line 617, a first arc 619, and a second arc 621.

In a specific implementation, length L5 is the distance across the back opening from first point 605 to a third point 623. The first and third points lie on the outline or boundary defining the back opening. The third point is opposite the first point. Length L5 indicates the longest distance across the back opening.

Length L5 is measured along a first direction extending from the first point towards the third point. In this specific implementation, the back opening is oriented so that the first direction is parallel to the upper sidewall, lower sidewall (see FIGS. 2 and 6A), or both. The first direction is perpendicular to the first sidewall (see FIGS. 2 and 6A), second sidewall, or both. A distance from the second point to the first sidewall is the same as a distance from a fourth point 625 to the first sidewall. A distance from the second point to the second sidewall is the same as a distance from the fourth point to the second sidewall. A distance from the first point to the upper sidewall is the same as the distance from the third point to the upper sidewall. A distance from the first point to the lower sidewall is the same as the distance from the third point to the lower sidewall.

However, in other implementations, the orientation of the back opening is rotated from the position shown in FIGS. 6A-B. The orientation of the back opening can be rotated from the position shown in FIG. 6B to any other position. Generally, the orientation of the back opening depends upon the orientation of the camera lens and flash of the electronic device. Orienting the back opening so that it aligns with the orientation with the camera lens and flash ensures that the case material will not block or interfere with the camera lens and flash.

For example, an electronic device may have a camera lens and flash having an orientation is that is rotated 60 degrees counterclockwise from the orientation shown in FIG. 6B (e.g., rotated 60 degrees counterclockwise from an x-axis having an origin at a center of the camera lens). The orientation of the back opening may be similarly rotated 60 counterclockwise from the orientation shown in FIG. 6B so that the back opening aligns with the reoriented camera lens and flash. In this specific implementation, the first direction is oblique to the upper, lower, first, and second sidewalls. The third point is closer to the upper sidewall than the first point. The second point is closer to the second sidewall than the fourth point.

As another example, an electronic device may have a camera lens and flash having an orientation that is rotated 90 degrees counterclockwise from the orientation shown in FIG. 6B. Again, the orientation of the back opening may be similarly rotated 90 degrees from the orientation shown in FIG. 6B so that the back opening aligns with the reoriented camera lens and flash. In this specific implementation, the first direction will be parallel to the first sidewall, second sidewall, or both. The first direction will be perpendicular to the upper sidewall, lower sidewall, or both. The third point is closer to the upper sidewall than the first point. The second point is closer to the second sidewall than the fourth point.

Width W5 is the distance across the back opening from fourth point 625 to second point 610. The fourth and second points lie on the outline or boundary defining the back opening. The fourth point is opposite the second point. Width W5 is measured along a second direction extending from the fourth point towards the second point. The second direction is perpendicular or transverse to the first direction. In this specific implementation, the back opening is oriented so that the second direction is parallel to the first sidewall, second sidewall, or both. The second direction is perpendicular to the upper sidewall, lower sidewall, or both.

However, as discussed above, in other implementations, the orientation of the back opening may be rotated so that it aligns with a reoriented camera lens and flash. Thus, the second direction may be oblique to the upper sidewall, lower sidewall, first sidewall, second sidewall, or combinations of these. The second direction may be perpendicular to the first sidewall, second sidewall, or both. The second direction may be parallel to the upper sidewall, lower sidewall, or both.

In this specific implementation, length L5 is greater than width W5. Length L5 is the maximum length of the back opening. Width W5 is the maximum width of the back opening. Length L5 and width W5 are measured transverse to each other. A ratio of width W5 to length L5 may be about 1:1.5, but can range from about 1:1 to about 1:5. This includes, for example, 1:1.1, 1:1.2, 1:1.3, 1:1.4, 1:1.6, 1:1.7, 1:1.8, 1:1.9, 1:2, 1:2.1, 1:2.2, 1:2.3, 1:2.4, 1:2.5, 1:2.6, 1:2.7, 1:2.8, 1:2.9, 1:3, 1:3.1, 1:3.2, 1:3.3, 1:3.4, 1:3.5, 1:3.6, 1:3.7, 1:3.8, 1:3.9, 1:4, or 1:4.9. The ratio may be less than 1:1 or greater than 1:5.

Generally, the dimensions of the back opening (e.g., length L5 and width W5) depend on factors including the size of the camera lens (e.g., diameter or area of the camera lens), size of the flash (e.g., diameter or area of the flash), the distance between the camera lens and flash, or combinations of these. For example, as the distance between the camera lens and flash increases, so too will length L5; that is, the back opening will become longer. As the distance between the camera lens and flash decreases, so too will length L5; that is, the back opening will become shorter.

In a specific implementation, a difference between length L5 and width W5 is about 4 millimeters. In another specific implementation, the difference is about 6 millimeters, but can range from about 1 millimeter to about 12 millimeters. This includes, for example, 2, 2.5, 3, 3.1, 3.2, 3.3, 3.4, 3.5, 3.6, 3.7, 3.8, 3.9, 4.1, 4.2, 4.3, 4.4, 4.5, 4.6, 4.7, 4.8, 4.9, 5, 5.1, 5.2, 5.3, 5.4, 5.5, 5.6, 5.7, 5.8, 5.9, 6, 6.1, 6.2, 6.3, 6.4, 6.5, 6.6, 6.7, 6.8, 6.9, 7, 7.1, 7.2, 7.3, 7.4, 7.5, 7.6, 7.7, 7.8, 7.9, 8, 8.5, 9, 10, 11, 11.9 millimeters, or more than 12 millimeters. The difference may be less than 1 millimeter. For example, the difference may be 0 millimeters such as when a shape of the opening is a square.

In a specific implementation, length L5 is about 13 millimeters. In another specific implementation, length L5 is about 15 millimeters, but can range from about 8 millimeters to about 25 millimeters. This includes, for example, 8, 9, 10, 11, 11.5, 12, 12.1, 12.2, 12.3, 12.4, 12.5, 12.6, 12.7, 12.8, 12.9, 13.1, 13.2, 13.3, 13.4, 13.5, 13.6, 13.7, 13.8, 13.9, 14, 14.1, 14.2, 14.3, 14.4, 14.5, 14.6, 14.7, 14.8, 14.9, 15.1, 15.2, 15.3, 15.4, 15.5, 15.6, 15.7, 15.8, 15.9, 16, 16.1, 16.2, 16.3, 16.4, 16.5, 16.6, 16.7, 16.8, 16.9, 17, 17.5, 18, 19, 20, 21, 22, 23, 24, 24.9 millimeters, or more than 25 millimeters. Length L5 may be less than 8 millimeters. In a specific implementation, length L5 is at least about 13 millimeters. Length L5 may be at least about 10, 11, 12, 14, 15, or 16 millimeters.

In a specific implementation, width W5 is about 9 millimeters, but can range from about 5 millimeters to about 18 millimeters. This includes, for example, 6, 7, 8, 8.1, 8.2, 8.3, 8.4, 8.5, 8.6, 8.7, 8.8, 8.9, 9.1, 9.2, 9.3, 9.4, 9.5, 9.6, 9.7, 9.8, 9.9, 10, 10.1, 10.2, 10.3, 10.4, 10.5, 10.6, 10.7, 10.8, 10.9, 11, 11.5, 12, 12.5, 13, 14, 15, 16, 17, 17.9 millimeters, or more than 18 millimeters. Width W5 may be less than 5 millimeters. In a specific implementation, width W5 is at least about 9 millimeters. Width W5 may be at least about 5 millimeters.

In various other implementations, length L5 and width W5 are the same. Width W5 is greater than length L5. In a specific implementation, an area of the back opening is about 117 square millimeters, but can range from about 50 square millimeters to about 200 square millimeters. This includes, for example, 60, 70, 80, 90, 95, 100, 105, 110, 115, 120, 125, 130, 135, 140, 150, 160, 170, 180, 190, 199.9 square millimeters, or more than 200 square millimeters. The area may be less than 50 square millimeters.

In this specific implementation, distance X5 is about 5.5 millimeters, but can range from about 2 millimeters to about 10 millimeters. This includes, for example, 2.5, 3, 3.5, 4, 4.1, 4.2, 4.3, 4.4, 4.5, 4.6, 4.7, 4.8, 4.9, 5, 5.1, 5.2, 5.3, 5.4, 5.6, 5.7, 5.8, 5.9, 6, 6.1, 6.2, 6.3, 6.4, 6.5, 6.6, 6.7, 6.8, 6.9, 7, 7.5, 8, 8.5, 9, 9.5, 9.9 millimeters or more than 10 millimeters. Distance X5 may be less than 2 millimeters. Distance Y5 is about 5.5 millimeters, but can range from about 2 millimeters to about 10 millimeters. This includes, for example, 2.5, 3, 3.5, 4, 4.1, 4.2, 4.3, 4.4, 4.5, 4.6, 4.7, 4.8, 4.9, 5, 5.1, 5.2, 5.3, 5.4, 5.6, 5.7, 5.8, 5.9, 6, 6.1, 6.2, 6.3, 6.4, 6.5, 6.6, 6.7, 6.8, 6.9, 7, 7.5, 8, 8.5, 9, 9.5, 9.9 millimeters or more than 10 millimeters. Distance Y5 may be less than 2 millimeters.

As shown in FIG. 6B, in this specific implementation, a shape of the back opening is an oval or a rectangle having rounded corners. This shape allows the edges (or ends) of the back opening to follow or at least partially follow the curvatures or outlines of the camera lens and flash which are typically circular. Having the shape of the back opening match, partially match, or resemble at least a portion of the outlines or shapes of the camera lens and flash can help to provide protection to the smartphone while still allowing the camera lens and flash to be unobstructed by the case material. That is, the surface area of the back of the smartphone outside of the camera lens and flash will be protected or covered by the case material, but the case material will not overlap or cover the camera lens and flash to block the camera lens and flash. Thus, in some cases it is desirable to select a shape for the back opening where the shape (or at least portions of the shape) resemble the shape of the camera lens, flash, or both.

In this specific implementation, the shape of the back opening is defined by first line 615, second line 617, first arc 619, and second arc 621. The first and second lines define the sides of the back opening. The first and second arcs define the ends of the back opening. The second line is parallel to the first line. The first arc is at an end of the back opening. The second arc is at an opposite end of the back opening. The first arc joins ends of the first and second lines. The second arc joins opposite ends of the first and second lines.

The arcs are curved lines. The first arc, second arc, or both are a continuous portion (as of a circle or ellipse) of a curved line. In a specific implementation, the first arc, second arc, or both are semicircles (i.e., half of a circle). In this specific implementation, a radius of an arc is constant. In another specific implementation, the first arc, second arc, or both include portions of an ellipse. In this specific implementation, a radius of an arc is not constant, i.e., is increasing or decreasing. An arc may be described as crescent-shaped, C-shaped, or sideways U-shaped.

In this specific implementation, the arcs are mirror images of each other. A length of the first arc is equal to a length of the second arc. A curvature of the first arc is equal to a curvature of the second arc. A third line, parallel to a y-axis, bisects or divides the back opening into a left half and a right half. The left and right halves are mirror images of each other. A fourth line, parallel to an x-axis divides the back opening into a top half and a bottom half. The top and bottom halves are mirror images of each other. In other words, the back opening is symmetrical about the x-axis and the y-axis. The back opening is symmetrical about two axes.

In another specific implementation, the arcs are not symmetrical or are not mirror images of each other. A length of the first arc is not equal to a length of the second arc. A curvature of the first arc is not equal to a curvature of the second arc. The back opening may be asymmetrical about the x-axis, y-axis, or both. The back opening may be asymmetrical about one axis and symmetrical about another axis. The back opening may be asymmetrical about two axes.

FIG. 6C shows a back of a case with a camera lens 630 and flash 631 of the portable electronic device exposed through the back opening. A detail section D6 indicates a shape of the back opening. The detail section may have any of the back opening shapes shown in FIGS. 6D-6H. That is, a case may have any of the back opening shapes or options shown in FIGS. 6D-6H.

FIG. 6D shows a first embodiment of the back opening. A case having this back opening may be referred to as an opaque case with a pill-shaped hole. This back opening shape may be described as an oval or a pill-shaped hole and may be similar to the back opening shown in FIGS. 6A-6B.

FIG. 6E shows a second embodiment of a back opening 640 for a case. This case may be referred to as an opaque case with an egg-shaped hole. The shape of this back opening may be described as egg-shaped, pear-shaped (e.g., pyriform), or teardrop-shaped. The shape may be described as a triangle with rounded corners or a sector with rounded corners and ends. In a specific implementation, this back opening has a length of about 13 millimeters and a width of about 9 millimeters.

In this specific implementation, the shape of the back opening includes a first line 642, second line 644, first arc 646, and second arc 648. The first arc is connected to ends of the first and second lines. The second arc is connected to opposite ends of the first and second lines. The first arc is different from the second arc. For example, a size of the first arc may be greater than the second arc, the first arc may have a greater degree of curvature than the second arc, the first arc may have a greater radius than the second arc, the first arc may have a greater length than the second arc, or combinations of these.

In this specific implementation, the first and second lines are at angle to each other. That is, the first and second lines extend in directions towards the second arc which intersect. An angle between the first and second lines may be about 60 degrees, but can range from about 15 degrees to about 89 degrees. This includes, for example, 20, 30, 40, 45, 50, 65, 70, 75, 80, 85, or 88.9 degrees. The angle may be less than 20 degrees.

In this specific implementation, the second arc is closer to the first sidewall of the case (FIG. 2) as compared to the first arc. That is, a distance between the second arc and the first sidewall is less than a distance between the first arc and the first sidewall. The first arc is closer to the second sidewall as compared to the second arc. That is, a distance between the first arc and the second sidewall is less than a distance between the second arc and the second sidewall.

However, as discussed above, it should be appreciated that the orientation of back opening 640 may be different from what is shown in FIG. 6E depending upon the orientation of camera lens 630 and flash 631. Thus, the orientation of the back opening may be flipped or rotated (e.g., rotated 90, 180, 45, 30, or 60 degrees) from what is shown in FIG. 6E depending upon the orientation of the camera lens and flash. For example, if the orientation of the camera lens and flash is rotated 180, the back opening may similarly be rotated 180 degrees from what is shown in FIG. 6E. That is, the first arc will be closer to the first sidewall as compared to the second arc. The second arc will be closer to the second sidewall as compared to the first arc.

If the orientation of the camera lens and flash is rotated 90 degrees in the clockwise direction, the back opening may similarly be rotated 90 degrees clockwise from what is shown in FIG. 6E. In this specific implementation, the first arc will be closer to the upper sidewall as compared to the second arc. The second arc will be closer to the lower sidewall as compared to the first arc.

If the orientation of the camera lens and flash is rotated 90 degrees counterclockwise, the back opening may similarly be rotated 90 degrees counterclockwise from what is shown in FIG. 6E. In this specific implementation, the second arc is closer to the upper sidewall as compared to the first arc. The first arc is closer to lower sidewall as compared to the second arc.

Again, generally, it will be desirable to select an orientation for the back opening such that the arc-end or curve-end of the back opening follows or resembles the curve of the camera lens or flash that the arc-end is near. This helps to ensure that the back surface finish of the electronic device will be protected and also helps to ensure that pictures, video, or both can be taken without interference by the case material.

FIG. 6F shows a third embodiment of a back opening 650 for a case. The shape of this back opening may be described as keyhole-shaped. This case may be referred to as an opaque case with combined holes. In a specific implementation, this back opening has a length of about 13 millimeters and a width of about 9 millimeters.

The shape of this back opening includes straight lines and curves. In this specific implementation, the shape of the back opening includes a first line 652, second line 654, first arc 656, and second arc 658. The first arc is connected to ends of the first and second lines. The second arc is connected to opposite ends of the first and second lines. The first arc is different from the second arc.

In this specific implementation, a length of the first arc is greater than a length of the second arc. The first arc, second arc, or both may be portions of a circle, oval, or ellipse. An arc or a portion of an arc may have constant radius, an increasing radius, or a decreasing radius. In this specific implementation, the first and second lines are parallel. In another implementation, the first and second lines are not parallel. For example, the first and second lines may extend in directions towards the second arc which intersect. The first and second lines may extend in a direction towards the first arc which intersect.

FIG. 6G shows a fourth embodiment of a back opening 660 for a case.

FIG. 6H shows a fifth embodiment of back openings 670 for a case. This case may be referred to as an opaque case with separate holes. This specific implementation includes two back openings: a first back opening 672 and a second back opening 674. In a specific implementation, a diameter of the first back opening is about 9 millimeters. A diameter of the second back opening is about 5 millimeters. However, these dimensions and other dimensions described in this application can vary depending upon factors such as the size of the camera lens and flash of the electronic device.

In this specific implementation, the first back opening exposes a camera lens of the smartphone. The second back opening exposes a flash of the smartphone. Shapes of the first and second back openings are circles. A diameter of the first back opening is different from a diameter of the second back opening. The diameter of the first back opening is greater than the diameter of the second back opening. This specific implementation of the case may be used where the size of the camera lens of the electronic device is greater than the size of the flash (e.g., diameter of camera lens greater than diameter of flash).

In another specific implementation, the diameter of the first back opening is less than the diameter of the second back opening. This specific implementation may be used where the size (e.g., diameter) of the camera lens is less than the size of the flash.

In another specific implementation, the diameter of the first and second back openings are the same. This specific implementation may be used where the sizes of the camera lens and flash are the same.

In the embodiment shown in FIG. 6H, the shapes of the first and second back openings are circles. The shape of the first back opening is the same as the shape of the second back opening. However, in other implementations, the shape of the first back opening is different from the shape of the second back opening. For example, the shape of the first back opening may be a polygon such as a square, rectangle, triangle, diamond. The shape of the second back opening may be a curved shape such as a circle, ellipse, or oval.

In a specific implementation, an area of the first back opening is different from an area of the second back opening. The area of the first back opening is greater than the area of the second back opening. In other implementations, the areas are the same. The area of the second back opening may be greater than the area of the first back opening such as when the flash of the smartphone has a greater area or diameter than the camera lens of the smartphone.

In the example shown in FIG. 6H, the first and second back openings are oriented so that the first back opening is closer to the second sidewall of the case. The second back opening is closer to the first sidewall of the case. However, as discussed above, the orientation of the openings can depend on the orientation of the camera lens and flash. Thus, in another specific implementation, the first and second back openings are oriented so that the first back opening is closer to the first sidewall of the case. The second back opening is closer to the second sidewall of the case.

In another specific implementation, the first and second back openings are oriented so that the first back opening is closer to the upper sidewall of the case. The second back opening is closer to the lower sidewall of the case. In another specific implementation, the first back opening is closer to the lower sidewall of the case. The second back opening is closer to the upper sidewall of the case.

In a specific implementation, a thickness of the case material between the first and second back openings is the same as a thickness of the case material outside the area or region of the first and second back openings. In another implementation, the thickness is less so that there is less likelihood that the case material will interfere with or block the camera lens, flash, or both.

The shapes shown in FIGS. 6E-H may be used, for example, where sizes (e.g., diameters) of the camera lens and flash of the smartphone are different. For example, a diameter of the camera lens may be greater than a diameter of the flash.

The back opening may be oriented so that when the case is placed on the smartphone, the camera lens is nearer to the first arc than the second arc, and the flash is nearer to the second arc than the arc. This can help to increase the amount of surface area of the smartphone that is covered by the case as compared to the case shown in FIG. 6D, while still allowing the camera lens and flash to be exposed.

In a specific implementation, the shape of the back opening is symmetrical about an x-axis and a y-axis. For example, the back opening in FIG. 6D is symmetrical about an x-axis passing through the back opening. The back opening is symmetrical about a y-axis passing through the back opening, and perpendicular to the x-axis. In another specific implementation, the shape of the back opening is symmetrical about one axis and is not symmetrical or is asymmetrical about another axis. For example, the back openings shown in FIGS. 6E-6H are symmetrical about an x-axis passing through the back opening. The back openings are not symmetrical or are asymmetrical about a y-axis passing through the back opening and perpendicular to the y-axis. In another specific implementation, the back opening is not symmetrical about the x-axis and y-axis. For example, as discussed above the back opening may be rotated from their position shown in FIGS. 6D-6H and into a position where the back opening is not symmetrical or is asymmetrical to both the x-axis and the y-axis.

It should be appreciated that the back opening can have any shape. Some examples of shapes include a circle, rectangle, square, triangle, obround (a shape having two semicircles connected by parallel lines tangent to their endpoints), oval, ellipse, tetragon, trapezium, trapezoid, parallelogram, gnomon, rhombus, deltoid, pentagon, quadrant, sextant, kidney, polygon, closed polygon (e.g., not a semicircle or arc), and so forth. The shape may have rounded corners, sharp corners, or both. The edges defining the back opening may be sloped or angled so that the back opening on a side nearest the camera lens and flash may be slightly smaller than the back opening on a side furthest from the camera lens and flash. This helps to ensure that the camera have a sufficient field of view degree so that edges of the back opening will not be captured by the camera. A back opening may be defined entirely by straight lines. A back opening may be defined entirely by curved lines. A back opening may be defined by a combination of curved and straight lines.

In this specific implementation, the back opening is formed from a single closed-shape or figure. In another implementation, the back opening may be formed from two open-shaped figures which when joined or merge form a closed-shaped. In this specific implementation, the first case portion includes a first open-shaped figure. The second case portion includes a second open-shaped figure. When the first and second case portions are seated against each other, the first and second open-shaped figures merge to form the closed-shaped back opening.

Further illustrations of various implementations of the back opening are shown in U.S. patent application Ser. No. 29/364,447, filed Jun. 23, 2010, which is incorporated by reference.

In a specific implementation, the back of a case has no back openings. The back of the case is a continuous surface that is uninterrupted by openings. In this specific implementation, the case may be made of a transparent material (e.g., a clear material) to permit light to pass through the case material and be received by the camera lens of the portable electronic device, to permit light from the flash to pass through the case material and illuminate the subject, or both. In other words, from the flash passes in a first direction through the case material. Ambient light, reflected light from the flash, or both, passes in a second direction, opposite the first direction, through the case material to be received by the camera lens.

Covering the camera lens and flash can further protect the camera lens and flash from damage (e.g., scratches), debris, or both. However, the portable electronic device is still able to take pictures, record video, or both because of the transparent case material.

In another specific implementation, the back of the case has a back opening for the camera lens, but not the flash. In this specific implementation, the back opening exposes the camera lens, but the flash is covered by the transparent or clear case material. The transparent case material allows light from the flash to be transmitted through the case material to illuminate the subject. In this specific implementation, a shape of the back opening is a circle having a diameter of about 9 millimeters. This case may be referred to as a clear case with a single camera hole.

In another specific implementation, the back of the case has a back opening for the flash, but not the camera lens. In this specific implementation, the back opening exposes the flash of the portable electronic device, but the camera lens is covered by the transparent case material. The transparent case material allows light to be transmitted through the case material and be received by the camera lens.

Figure 7A:
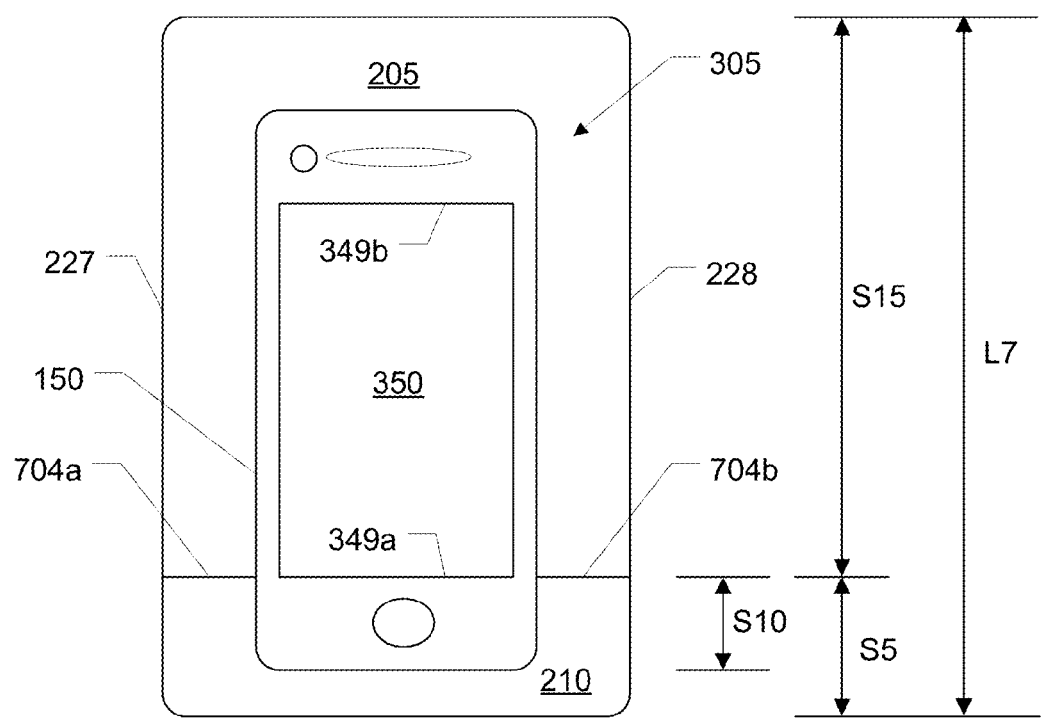
FIG. 7A shows a front of the case with a portable electronic device in the case and a first embodiment of a seam line where the upper and lower case portions meet.
Figure 9:
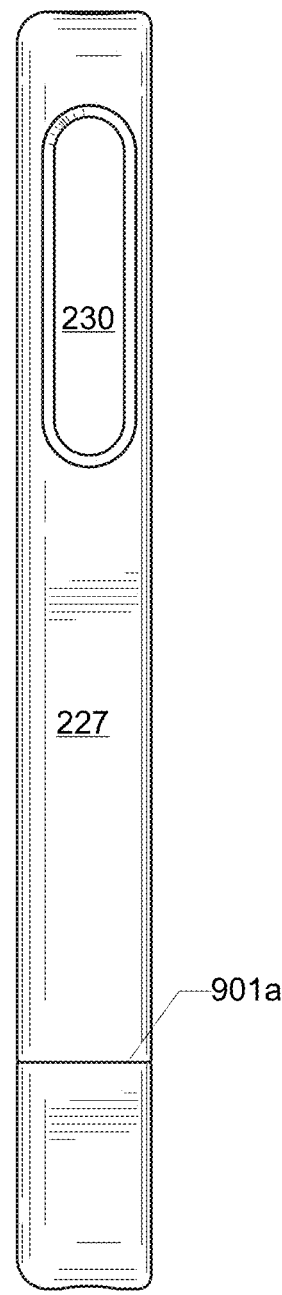
FIG. 9 shows a left side view of the assembled case.
Figure 10:
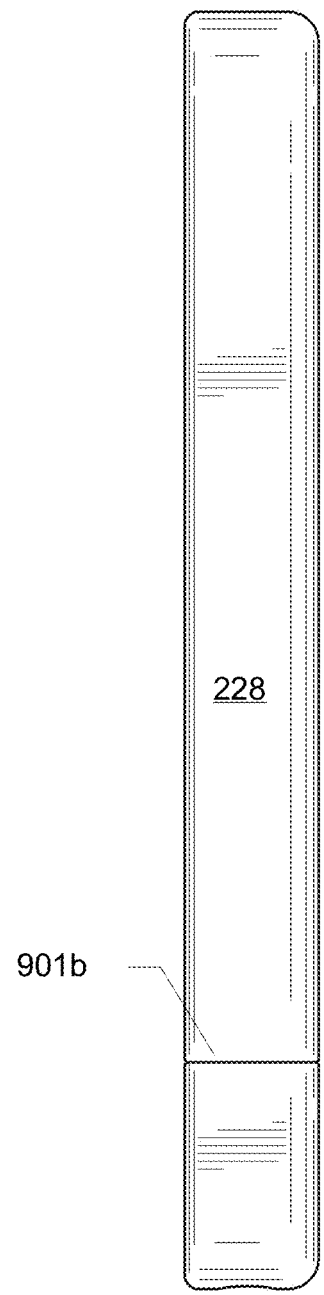
FIG. 10 shows a right side view of the assembled case.

FIG. 7A shows the front of a case with an electronic device in the case and dimensions S5, S10, and S15. As described above, the upper case portion slides over the lower case portion. Where the upper and lower case portions meet, there are first and second seam lines 704a and 704b, respectively, in the front of the case (see also FIG. 8A). The seam line (from 704a to 704b) runs around the entire case (e.g., across the back and sides of the case). FIG. 6A shows the seam line for the back, and FIGS. 9 and 10 show the seam lines for the sides. At the seam, the surfaces of the lower and upper case portions are relatively flush with each other. The seam line remains visible and can be felt tactilely. The seam may be referred to as a horizontal part line.

The seam line for the case is positioned to ensure the upper and lower case portions are securely attached to each other. In a specific implementation, seam lines 704a and 704b are positioned so that they align with a bottom edge 349a of screen 350 of the phone. As shown in FIG. 7A, with the phone in the case, bottom edge 349a of touch screen 350 is in-line with lines 704a and 704b.

The upper case portion securely engages (e.g., by overlapping) to the phone and lower case portion, so the upper case portion will not inadvertently slide off or otherwise detach. Also, in an implementation, when the user grips the phone in a portrait orientation, part of the hand (e.g., thumb and forefinger) is holding onto the upper case portion, while the palm of the hand is pushing against the lower case portion (urging the lower case portion toward the upper case portion). As shown in FIGS. 2 and 4 and discussed above, the lower case portions includes insert 410 (FIG. 4) which is inserted into sleeve 267 (FIG. 2) of the upper case portion. The sleeve snugly encloses the insert to prevent the upper and lower portions from accidentally separating.

Positioning the seam line at the position shown in FIG. 7A has several benefits. One benefit is that when the portable electronic device is in the case, the positioning of the seam line can make the case more stable by helping to prevent the lower case portion from detaching, flipping, twisting, snapping, or popping off of the electronic device and upper case portion.

Specifically, the portable electronic device is held within the case by being sandwiched between the back of the case and frame edges 247 (FIG. 2). More particularly, the lower side border edges of the electronic device are sandwiched between first and second side frame edges 248a and 248b (FIG. 2) of the lower case portion. The side frame edges are opposite each other and extend from the lower sidewall, towards the seam and top edge, and terminate at the raised lip. When there is a force (e.g., bending force or torque about a lateral axis) on the lower case portion, the side frame edges can act as lever arms against the electronic device. That is, when there is a bending force, the side frame edges (or ends of the side frame edges) press on the lower side border edges of the electronic device to resist the bending force. This helps to prevent the lower case portion from popping off. Thus, it is generally desirable that the side frame edges extend at least some distance from the lower sidewall so that the side frame edges may be able to act as lever arms to resist the bending force.

Further, aligning seam lines 704a and 704b with the bottom edge of the touch screen provides for a symmetrical arrangement and appearance of the visual elements of the phone and case. This enhances the smartphone experience for the user, allowing the user to easily locate the display both visually and tactilely (because the user can feel for the seam).

A length of the first seam line is from first sidewall 227 to front opening 150. A length of the second seam line is from second sidewall 228 to front opening 150. In this specific implementation, the lengths of the first and second seam lines are the same. That is, the front opening is centered between the first and second sidewalls.

In another specific implementation, lengths of the first and second seam lines are different. For example, the length of the first seam line may be greater or less than the length of the second seam line. That is, the front opening may be offset between the first and second sidewalls. The front opening may be closer to one sidewall as compared to another sidewall. This specific implementation may be used when the case is to be placed on its side on a surface (e.g., table) for viewing the electronic device's screen. The user can place the case on the table in an orientation such that the front opening will be furthest away from the table. This can help to improve the viewing angle of the electronic device's screen and position the screen at a comfortable height from the table.

In an implementation, for the front of the case, the first and second seam lines are at about 21.1 millimeters from a bottom edge or lower sidewall of the case as indicated by distance S5. A case length L7 is about 118.7 millimeters. This seam line divides the case at about 0.18 of the whole. In other implementations, the seam line can be at other positions (e.g., ranging from about 15 millimeters to about 50 millimeters) and have other ratios (e.g., ranging from 0.10 to 0.50 of the whole).

In this specific implementation, the seam line is straight around the case or lies in a plane perpendicular to the front opening of the case. Thus, in this specific implementation, for the front of the case a distance from the bottom edge of the case to the seam line is distance S5, i.e., distances from the seam line to the lower sidewall of the case are the same regardless of whether the measurement is taken from the front of the case, the back of the case, or the sides of the case. In this specific implementation, seam lines 704a and 704b in the front of the case are about X of a length of the joined case, and a seam line for the back of the case is about Y of a length of the joined case. X and Y are numbers and Y is equal to X.

In another implementation, the seam line or portions of the seam line such as portions of the seam line on the sides of the case may be angled or slanted. Angled seam lines are discussed in U.S. Pat. No. 7,612,997, issued Nov. 3, 2009, and U.S. patent application Ser. No. 12/580,977, filed Oct. 16, 2009, which are incorporated by reference.

Further, a distance S10 between a bottom edge of front opening 150 and seam line 704b is about 17.4 millimeters. A length of front opening 150 is about 111 millimeters and a width of the front opening is about 54 millimeters. The seam line may divide the front opening at about 0.157 of the whole. In other implementations, distance S10 can vary, depending on for example the screen size, in a range from about 8 millimeters to about 60 millimeters. The seam line will divide the opening in a range, for example, from about 0.10 to about 0.50 of the whole. In another specific implementation, distance S10 is about 33.2 millimeters.

A distance S5 is from the seam line to the lower sidewall. A distance S15 is from the seam line to the upper sidewall. A length L7 is from the lower sidewall to the upper sidewall and indicates an overall length of the assembled case. Thus, the following formulas can be used to show the relationship among L7, S5, and S15.

$$L7 = S5 + S15 \quad (1)$$

$$S5 = L7 - S15 \quad (2)$$

$$S15 = L7 - S5 \quad (3)$$

The seam can be located anywhere along the length of the case. For example, when the seam is located in the middle of the case, S15 and S5 will be the same. When the seam is located closer to the upper sidewall than the lower sidewall, distance S5 will be greater than distance S15. When the seam is located closer to the lower sidewall than the upper sidewall (as shown in FIG. 7), distance S5 will be less than distance S15. Distance S5 can be any number less than L7. Distance S15 can be any number less than L7. Distances S5 and S15 can be any number less than L7 as long their sums are equal to L7.

These distances and dimensions of the case can vary greatly depending upon factors such as the size of the electronic device (e.g., length, width, and thickness), the location of the screen of the electronic device, or both. In a specific implementation, a width of frame edges 247 (FIG. 2) may be about 3.7 millimeters. A distance from top edge 263 (FIG. 2) to lower sidewall 240 may be about 33.2 millimeters.

In a specific implementation, distance S5 is about 21.1 millimeters, but can range from about 10 millimeters to about 110 millimeters. This includes, for example, 11, 12, 13, 14, 15, 16, 17, 18, 19, 20, 21, 22, 23, 24, 25, 26, 27, 28, 29, 30, 40, 50, 60, 70, 80, 90, 100, 109.9 millimeters, or more than 110 millimeters. Distance S5 may be less than 10 millimeters. In another specific implementation, distance S5 is about 33.2 millimeters.

In a specific implementation, distance S15 is about 97.6 millimeters, but can range from about 10 millimeters to about 110 millimeters. This includes, for example, 11, 12, 13, 14, 15, 16, 17, 18, 19, 20, 21, 22, 23, 24, 25, 26, 27, 28, 29, 30, 40, 50, 60, 70, 80, 90, 100, 109.9 millimeters, or more than 110 millimeters. Distance S15 may be less than 10 millimeters.

In a specific implementation, length L7 is about 118.7 millimeters, but can range from about 80 millimeters to about 140 millimeters. This includes, for example, 90, 100, 110, 120, 130, 139.9 millimeters, or more than 140 millimeters. Length L7 may be less than 80 millimeters.

In this specific implementation, the first and second seam lines of the seam are visible from a front of the case. The first seam line is on one side of front opening 150 (i.e., left-hand side). The second seam line is on an opposite side of the front opening (i.e., right-hand side). The first and second seam lines are in-line with bottom edge 349a of the touch screen. That is, the first seam line is at one end of bottom edge 349a and the second seam line is at an opposite end of bottom edge 349a. The first and second seam lines extend in a direction coincident with bottom edge 349a.

Figure 7B:
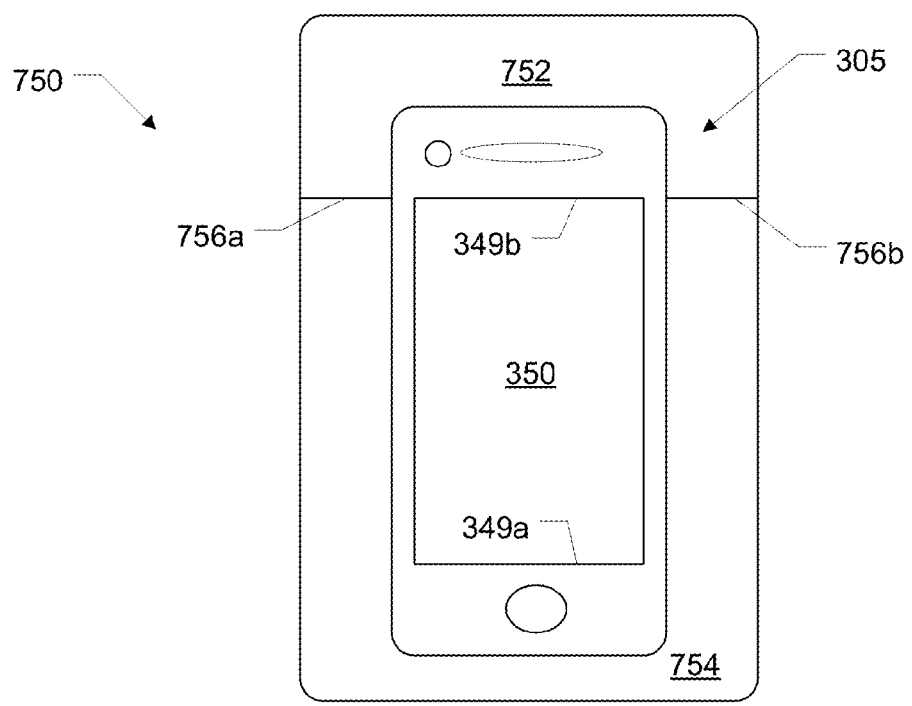
FIG. 7B shows a front of a case with a portable electronic device in the case and a second embodiment of a seam line where the upper and lower case portions meet.
Figure 7C:
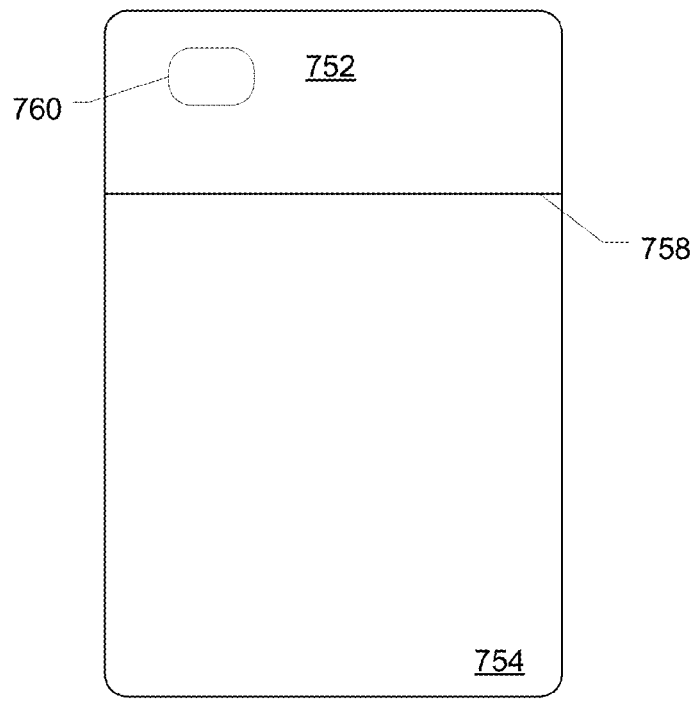
FIG. 7C shows a back of the case shown in FIG. 7B.

FIGS. 7B-7C show another specific implementation of a position for the seam lines. The case shown in FIGS. 7B-7C is similar to the case shown in FIG. 7A where the upper case portion and lower case portions are swapped. For FIGS. 7B-7C, a length of the upper case portion is shorter than a length of the lower case portion, which is the reverse of that for the case in FIG. 7A.

Specifically, FIG. 7B shows the front of a case 750 with the electronic device in the case. FIG. 7C shows a back of the case shown in FIG. 7B. Referring now to FIG. 7B, this case includes an upper case portion 752 and a lower case portion 754. The upper and lower case portions meet to form third and fourth seam lines 756a and 756b, respectively. The third and fourth seam lines are part of a seam 758 (FIG. 7C) that extends across a back of the case.

In this specific implementation, the third and fourth seam lines aligned with or are in-line with top edge 349b of screen 350 of the electronic device. The third and fourth seam lines are opposite each other, i.e., are on opposite sides of the screen. That is, the third seam line is at one end of top edge 349b of the screen. The fourth seam line is at an opposite end of top edge 349b of the screen.

FIG. 7C shows the back of the case shown in FIG. 7B. Upper case portion 752 includes a back opening 760. Seam 758 extends across a back of the case. The case shown in FIG. 7C is similar to the case shown in FIG. 6A with the exception of the seam line. For example, in FIG. 6A, a distance from the seam line to the back opening is greater than a distance from the seam line to the lower sidewall. In FIG. 7C, the relationship between the distances is swapped. That is, in FIG. 7C, the distance from the seam line to the back opening is less than the distance from the seam line to the lower sidewall.

In other implementations, the seam lines can be at positions other than the positions shown in FIGS. 6A and 7A-7C. For example, the seam line can be anywhere between the upper and lower edges of the screen.

The seam lines may be located anywhere on a front of the case. The first and second seam lines may not be in a line. In various implementations, the first seam line extends in a direction that is not coincident with the second seam line. One of the first or second seam lines is in-line with bottom edge 349a. Another of the first or second seam lines is in-line with top edge 349b. The first and second seam lines extend in a direction that is not coincident with bottom edge 349a. A seam line is in-line with a bottom edge of the smart phone housing. A seam line is in-line with a top edge of the smart phone housing.

In a specific implementation, a seam line is between bottom edge 349a and top edge 349b of the screen. For example, the seam line may be at a midpoint of the length of the screen. The seam line may be between bottom edge 349a of the screen and the midpoint of the length of the screen. The seam line may be between top edge 349b of the screen and the midpoint of the length of the screen. In a specific implementation, a first distance is from the seam line to top edge 349b of the screen. A second distance is from the seam line to bottom edge 349a of the screen. The first and second distances may be the same. The first distance may be different from the second distance. For example, the first distance may be greater or less than the second distance.

In a specific implementation, a seam line is between top edge 349b of the screen and a top edge of the smart phone housing. A first distance is from the seam line to top edge 349b. A second distance is from the seam line to bottom edge 349a. In this specific implementation, the second distance is greater than the first distance. In another implementation, a seam line is between bottom edge 349a of the screen and a bottom edge of the smart phone housing. In this specific implementation, the second distance is less than the first distance.

In this specific implementation, lengths of the first and second seam lines are the same. In another implementation, the lengths are different. For example, a length of the first seam line may be greater than a length of the second seam line.

In this specific implementation, the first and second seam lines are straight. That is, the first and second seam lines are perpendicular to a side defining the front opening of the case. The first and second seam lines are parallel to the lower and upper sidewalls. In another implementation, the first seam line, second seam line, or both may be sloped or angled. For example, a seam line may be oblique the side of the front opening of the case.

As discussed above and shown in FIG. 6A, the seam extends across the back of the case. In this specific implementation, back seam line 601 is straight. The back seam line is parallel to the lower sidewall of the lower case portion. The back seam line is parallel to the upper sidewall of the upper case portion. The back seam line extends in a direction perpendicular to left and right-hand sidewalls of the case.

However, in another implementation, the back seam line is angled or sloped. That is, the back seam line extends in a direction oblique to the left and right-hand sidewalls of the case. It should be appreciated that the back seam line can have any profile. For example, the back seam line may be curved, wavy, jagged, sawtooth, stepped, staircase, or have any desired pattern. These patterns can simplify the manufacturing process, make the upper and lower case portions less likely to accidentally detach, or both. For example, a sawtooth pattern or profile can help resist longitudinal twisting of the case to prevent the case portions from accidentally detaching.

As discussed above and shown in FIGS. 9-10, the seam extends across the left and right-hand sides of the case. In this specific implementation, the left and right-hand seams are straight. That is, the seams extend in a direction perpendicular to the front and back sides of the case. However, as in the back and front seam lines, this is not always the case. For example, the left-hand side seam, right-hand side seam, or both may be angled or sloped, or have any profile or desired pattern (e.g., curved, wavy, jagged, sawtooth, stepped, or staircase).

In a specific implementation, surfaces of the case are flat or planar (see FIGS. 1, 5-6A and 9-10). The flat surfaces ensure the electronic device and case will be stable (e.g., not rock back and forth) when the case is placed on its back or sides on a table. Even if the electronic device does not have a flat back, the flat portion of the case ensures the electronic device will be stable when placed on a table.

As shown in the various figures (e.g., FIG. 5), both the upper and lower case portions have sections or surfaces which are flat (e.g., back, side, and end surfaces which are flat). Where the upper and lower case portions meet, a seam line divides the upper and lower case portions. As shown, the flat case section of the lower case portion is smaller in terms of area than the flat section of the upper case portion. The seam where the upper and lower case portions meet is flush, so the seam does not cause the case to be unstable.

The flat back, side, and end surfaces ensure stability when the case is placed on its back, side, or end, regardless of how the back, sides, or ends of the phone are shaped. This feature creates a steady and stable surface and ensures that the electronic device will not slide or wobble as a result of being placed, for instance, on a table. For example, an electronic device may be curved in all directions (e.g., no flat surfaces at all) or have a design where the back, sides, or ends will not be stable when placed on a table. The design may have notches, indentations, or other structures (possibly ornamental) that cause the phone to not lie stably on its back, sides, or ends. Despite this, when the phone is in the case, because of the flat back, sides, and ends, the case will rest securely when placed on its back, sides, or ends.

In a specific implementation, the surfaces or exterior surfaces of the case are joined at rounded or curved edges or corners (see FIGS. 1 and 4). This feature helps to make the case less likely to chip at the corners. Blunting or rounding the corners can also make the case less likely to snag on clothing. The case will be comfortable to place in a pocket because a rounded corner will not poke the user. Further, rounded corners can also reduce the amount of case material needed to make a case as compared to a case having straight or sharp corners. However, in another specific implementation, exterior surfaces of the case are joined at straight corners. Joining the case at straight corners can increase the amount of flat surface area of the case to ensure that the case will be stable when placed on, for example, a table.

A specific flow for making a case as described in this application is described below. However, it should be understood that the invention is not limited to the specific flows and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data or situation.

1. Forming an upper case portion of a case, configured to be seated against a lower case portion. The upper case portion may be formed using injection molding. There is a mold of the case portion. A liquid or uncured plastic is injected or poured into the mold along with a catalyst. The mold and plastic is subjected to a temperature to activate the catalyst and material. After a sufficient time for processing to occur, the mold can be opened, and the plastic case portion removed. The case portion can be cleaned and flashing removed. The mold used in the processing can include features that will form features (e.g., camera-flash opening) of the case described in this application.

2. Forming the lower case portion of the case. Injection molding may also be used for the lower case portion.

3. Forming a back opening through a back of the case to make visible a camera lens and flash of a portable electronic device that will be placed in the case. For example, a mold used in processing a case will have a feature that will form the back opening described. The mold will have regions where plastic will be (e.g., vessels or channels) and also regions where plastic will be absent (e.g., solid mold material that prevents plastic from curing or forming where the camera-flash opening is desired).

In steps 1 and 2, the method includes forming the upper and lower case portions of the case. In a specific implementation, an insert is formed in the lower case portion. A sleeve to receive the insert is formed in the upper case portion. When the upper and lower case portions are seated against each other (i.e., the insert is received by the sleeve), a seam is formed which extends around the case. In another specific implementation, the sleeve is formed in the lower case portion and the insert is formed in the upper case portion.

The upper and lower case portions may be made using any manufacturing technique. Some examples of manufacturing techniques that may be used to make a case include injection molding, stereolithography, selective laser sintering, fused deposition molding, polyjet, casting (e.g., cast urethane molding), CNC machining, or combinations of these.

In a step 3, the method includes forming a back opening through a back of the case. In a specific implementation, the size of the back opening formed is sufficient to make visible a camera lens and flash of the portable electronic device that is to be placed in the case. In a specific implementation, a length of the back opening is greater than a width of the back opening. The length and width are measured in directions transverse to each other. In this specific implementation, a single back opening exposes two features (e.g., camera lens and flash) of the electronic device. In another specific implementation, there are two or more back openings. A first back opening exposes camera lens. A second back opening exposes a flash.

In another specific implementation, no back opening is formed through the back of the case. In this specific implementation, the case is made of a transparent material so that light from the flash can be transmitted through the transparent case material. And ambient light, light reflected from the flash, or both, can be received by the camera lens. A case may be made of transparent material and have a single back opening that exposes one of the camera lens or flash.

In a specific implementation, the back opening is formed in the upper case portion. In another specific implementation, the back opening is formed in the lower case portion. In another specific implementation, a first portion of the back opening is formed in the upper case portion. A second portion of the back opening is formed in the lower case portion. When the upper and lower case portions are joined, the first and second back opening portions merge to form a single opening.

The back opening may be formed using any manufacturing technique. In a specific implementation, the upper and lower case portions are formed via injection molding and the back opening is formed during the injection molding process. In another implementation, the back opening is formed after the upper case portion, lower case portion, or both are completed. For example, the back opening may be formed by drilling or milling a hole through the back of the case (e.g., through the upper case portion, lower case portion, or both).

In a specific implementation, the method includes coloring an edge of the back opening a black or other dark color, attaching a black or other dark colored grommet to the back opening, or both. The black or dark color can help to reduce the glare from the flash to the camera. This step is optional and is not included in some implementations of the case. Techniques to reduce or prevent glare to the camera from the flash are further discussed in U.S. patent application 61/365,302, filed Jul. 16, 2010, which is incorporated by reference.

The edging of the camera-flash opening (any other openings) may be changed to a different color from that of the material. For example, when the case material is white or other light color, edging of the camera-flash opening (and other openings) may be made black or other darker color than that of the case material. Applying the coloration to the openings may be a subsequent step after the case is formed.

The method may further include forming or applying cushioning material to the case, forming other openings to make accessible other features of the portable electronic device, forming covers to be placed over one or more openings of the case, applying a coating to the case (e.g., applying glare reducing coating to back opening edge), applying a surface treatment to the case (e.g., applying a rubberized texture to the case), or combinations of these.

In a specific implementation, the method includes one or more steps for customizing the case. For example, a user can customize a case by having an image (e.g., photograph or picture) supplied by the user printed or made visible on an exterior of the case.

1. Server system of manufacturer, via a network (e.g., Internet), receives an image from a user.

2. Image is processed to an appropriate size and divided into a first portion and a second portion.

3. First portion of image is made visible on the back surface of the upper case portion.

4. Second portion of image is made visible on the back surface of the lower case portion.

5. Case having image is sent to the user.

In step 1, the server system receives an image from the user that the user would like to have on her case. The user may, for example, upload or e-mail an image to the server system. The image may be contained in a file (e.g., .jpg file, .tiff file, or any other file format). In another implementation, the user may mail (e.g., via U.S. Postal Service) a photograph to the manufacturer that the user would like to have on her case. In another specific implementation, the user brings the photograph to a third-party or customizer who scans the photograph and sends the scan to the case manufacturer.

The image may be a picture or photograph of the user's child (e.g., son or daughter), pet, car, parents, brother, sister, wife, husband, partner, uncle, aunt, grandparents, grandchild, and so forth. The image may be a picture that the user has taken while, for example, on a vacation.

In step 2, the image is processed to an appropriate size and divided or cut into first and second portions. For example, the image may be reduced in size (e.g., pixels) so that it will fit on the case.

In steps 3-4, the first and second image portions are made visible on the back surfaces of the upper and lower case portions, respectively. The image may be made visible using any technique that results in the image being visible on the case. Some examples of techniques that may be used include printing, silkscreen printing, etching, laser etching, chemical etching, painting, or combinations of these.

In step 5 the case is sent to the user. The user may, for example, receive a notification (e.g., e-mail notification) that the case is complete. The user may then log into the Web site of the manufacturer, complete payment of the case, and the case will be mailed to the user.

In another specific implementation, the manufacturer, after receiving the image from the user, provides the user with a decal or sticker having the image. A side of the decal opposite the image has an adhesive so that the decal can adhere to the back of the case. The decal may have a first portion to be placed on the upper case portion and a second portion to be placed on the lower case portion. The decal is mailed to the user. The user can then peel the backing away from the decal and place the decal on the back of the case.

In another specific implementation, the case is semicustomizable. In this specific implementation, the manufacturer provides the user with several predetermined elements (e.g., images, graphics, or colors). The user then selects the combination of elements desired for the case. For example, in a specific implementation, a case includes two or more colors. The upper portion of the case includes a first color. The lower portion of the case includes a second color. The second color may the same as or may be different from the first color. The user can select an upper case portion having one color (e.g., white) and select a lower case portion having another color (e.g., red). Then, the user will have a red and white case.

In a specific implementation, the case includes an image on the back surface of the case. The lower case portion includes a first back surface having a first portion of the image. The upper case portion includes a second back surface having a second portion of the image. When the first and second case portions are seated against each other, the first and second image portions combine to form a single image or to complete the image. The image formed by joining the upper and lower case portions may be a national flag (e.g., U.S. flag, Spanish flag, or Canadian flag), flowers, abstract art, art, cartoons, animals, birds, famous people, celebrities (e.g., rock stars and supermodels), actors, actresses, musicians, skulls, robots, trees, company logos, landscapes, and so forth. The image may depict or suggest messages of protest (e.g., political protest, social protest, or environmental protest). An image may be any visual representation of something. An image may include graphics, patterns (e.g., strips and polka dots), colors, and so forth.

In a specific implementation, the image is preprinted or predetermined for the user or consumer. That is, the user can purchase a case having a preprinted image. In another specific implementation, the case is customizable with an image provided by the user.

In another implementation, laser etching is used to create or form an image on a back of the case. For example, the case material is such that applying a laser will create a pattern on the surface of the case. The material can be thermally activated to change color where the laser is applied, such as white case material changing to black where the laser is directed. Further, the case material may be coated will a metallic coating and the laser etches through the metallic coating to reveal the case material underneath. The laser can etch any desired pattern, such as directed by a computer to trace an image (such as received from a user or selected by a user).

Figure 8A:
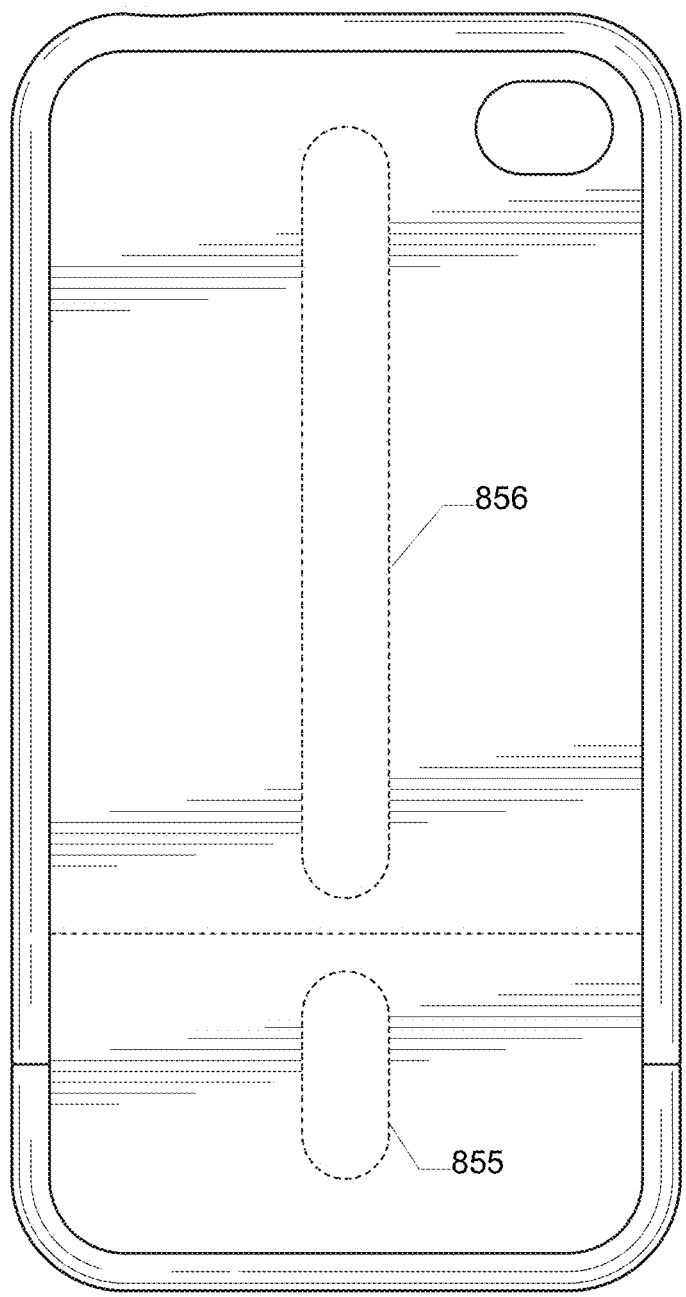
FIG. 8A shows a front of the case with protective strips.

FIG. 8A shows a front view of a first embodiment of the case with protective strips. In this specific implementation, the lower case and upper case portions have protective strips, spines, or rails 855 and 856, respectively. A protective strip may be referred to as an interior rubber guard rail. Protective strip 855 is on a front or interior surface of a back wall of the lower case portion. Protective strip 856 is on a front or interior surface of back wall of the upper case portion. The protective strips protect and cushion the smartphone while the smartphone is in the case. When placed in the case, a back of the electronic device will be placed against the front surfaces of the lower and upper case portions. The protective strips will help protect the device.

The interior surfaces of the case portions have a contour that matches or conforms to the back of the phone or other device which will lie on the interior surfaces. For example, if the phone has a convex curved back, then the interior surface will have a concave curved surface. If the phone has a flat back, then the interior surface will have a flat surface. The interior surface gives good support for the electronic device.

In a specific implementation, the protective strips include an over-molded thermoplastic elastomer (TPE). Over-molding is an injection molding process where one material (e.g., a TPE) is molded onto a second material, such as the material of the case (e.g., rigid plastic). The over-molded TPE forms a strong bond with the material of the case that is maintained in the end-use environment. In some implementations, primers or adhesives may be used to achieve a tight bond between the two materials.

The protective strips help to protect the electronic device from scratches, provide shock absorption (i.e., cushion electronic device), and help to ensure a tight and secure fit for the electronic device. The protective strips may be described as rubbery or "grippy."

Generally, the texture or feel of the over-mold (or soft touch over mold) is dependent on material properties (e.g., hardness, modulus, and coefficient of friction), texture, and the TPE wall thickness.

These factors may be varied to achieve the desired result. For example, by varying these factors, the protective strip may be made to be spongy, hard, soft, have a high coefficient of friction, have a low coefficient of friction, and so forth.

In this specific implementation, a coefficient of friction (COF) of the protective strip is greater than a coefficient of friction of the surface upon which the protective strip is attached or bonded to. For example, the COF of the first protective strip is greater than a surface of a back sidewall of the top portion of the case to which the first protective strip is attached. Generally, when two surfaces are dragged flat against each other, the resulting resistance is characterized as friction. The coefficient of friction characterizes the degree of force required to move one surface across another—either from a complete stop (static friction) or when the surface is already moving (kinetic friction).

Generally, the protective strip is designed (or has properties) such that it can provide some level of shock absorption and have a COF such that the electronic device will be secure within the case, but still allows the electronic device to be easily removed from the case.

In a specific implementation, the first protective strip, second protective strip, or both have a COF sufficient to overcome the weight of the electronic device. For example, the electronic device may be placed within the cover and when a user holds the top cover portion vertically, while not holding the bottom cover portion, the electronic device will not slide out.

In various implementations, a COF of the first protective strip is equal to a COF of the second protective strip. A COF of the first protective strip is less than a COF of the second protective strip. A COF of the first protective strip is greater than a COF of the second protective strip.

The protective strips may include any type of flexible, soft, or resilient material. For example, the protective strips may include material such as a rubber, spongy foam rubber, an elastomeric material, urethane, silicon, fabric, leather, foam, velvet or velvet-like material, felt, neoprene, or combinations of these. A protective strip may be referred to as a grip, bumper, ridge, shock absorption mechanism, or retaining mechanism. The protective strip may be attached to the case using an adhesive (e.g., epoxy).

The strips extend in the vertical direction along the interior base surfaces of the upper and lower case portion. The strips are typically a different material than the interior base surface material and may rise slightly above the surface. These strips can be made of a material that has cushioning properties such as rubber, vinyl, polymer, plastic, foam (e.g., material with bubbles), silicone, or felt. Depending on the material used, the strips may also be slightly tacky. These strips help cushion the electronic device and prevent it from becoming scratched or marred, especially when inserting the device into the upper and lower case portions. The strips also help to gently grip the electronic device so that it does not inadvertently slide or become as easily dislodged from the upper and lower case portions. The strips can help protect the finish of the back of the portable device.

FIG. 8A shows a specific arrangement and number of strips, but in other implementations, there can be any number of strips in any arrangement. For example, there can be three, four, or more than four strips. A strip may run in a lengthwise or vertical direction. A strip can run in a widthwise or horizontal direction. A strip can run in a diagonal direction. There can be multiple strips running in different directions (e.g., lengthwise, widthwise, or diagonal). One of the upper or lower case portions may have a strip while another of the upper or lower case portions does not have a strip. Reducing the number of strips can reduce the amount of material to make a case which can lower costs.

Figure 8B:
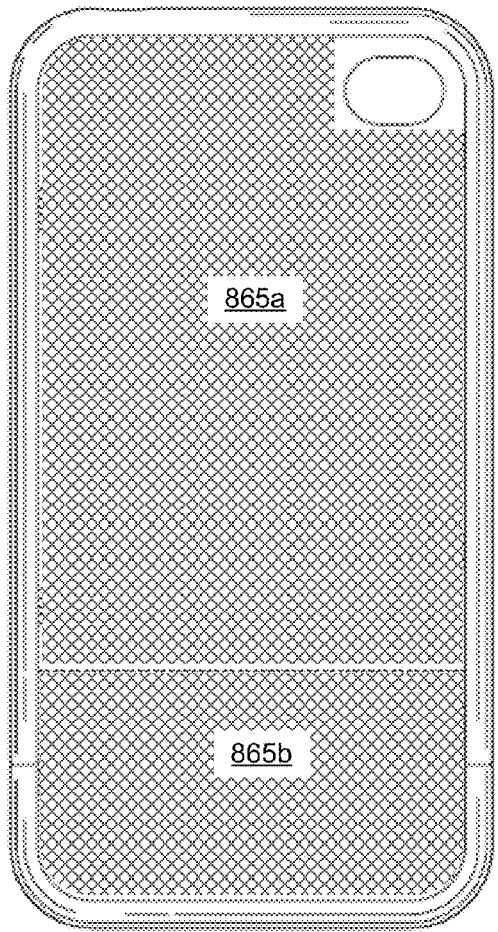
FIG. 8B shows a front of the case with protective coverings.

FIG. 8B shows a front view of a second embodiment of the case with first and second protective coverings 865a and 865b, respectively. In a specific implementation, the protective covering includes felt, i.e., a cloth made of wool and fur often mixed with natural or synthetic fibers through the action of heat, moisture, chemicals, and pressure. The protective covering can help to prevent scuffing of the electronic device, absorb shock, or both.

In a specific implementation, the protective covering is applied to both the upper and lower case portions. In another implementation, the protective covering is applied to at one of the upper and lower case portions and is not applied to another of the upper and lower case portions. For example, the protective cover may cover the back of the upper case portion and be omitted from or not cover the back of the lower case portion. The protective cover may cover the back of the lower case portion and be omitted from or not cover the back of the upper case portion. Omitting the protective covering from one of the case portions can reduce costs (e.g., material costs, labor costs, or both).

In the example shown in FIG. 8B, the protective coverings completely cover or almost completely cover the interior surface of the upper and lower case portions. That is, the area or surface area of the protective coverings is greater than the surface area of the case not covered by the protective coverings. In another implementation, a case has less of the protective coverings than the example shown in FIG. 8B. This can help to reduce costs. The surface area of the back of the case not covered by the protective coverings is greater than the surface area of the protective coverings.

Using protective strips as shown in FIG. 8A may be less expensive than covering the case with protective coverings as shown in FIG. 8B because there is less material to purchase and apply. This cost savings can then be passed to the consumer. However, using more protective covering material can provide a greater degree of protection (e.g., shock-absorption or scratch protection). Thus, in some cases it will be desirable to have the protective covering implementation shown in FIG. 8B.

A case may include both protective strips and protective coverings. For example, one of the upper or lower case portions may include a protective strip. Another of the upper or lower case portions may include a protective covering. In a specific implementation, the upper case portion includes a protective strip. The lower case portion includes the protective covering. In this specific implementation, the protective strip may be more "grippy" than the protective covering. This allows the lower case portion to easily detach from the upper case portion, while the electronic device remains in the upper case portion, so that the electronic device can be docked. In another specific implementation, a case portion may include both the protective strip and protective cover.

Figure 8C:
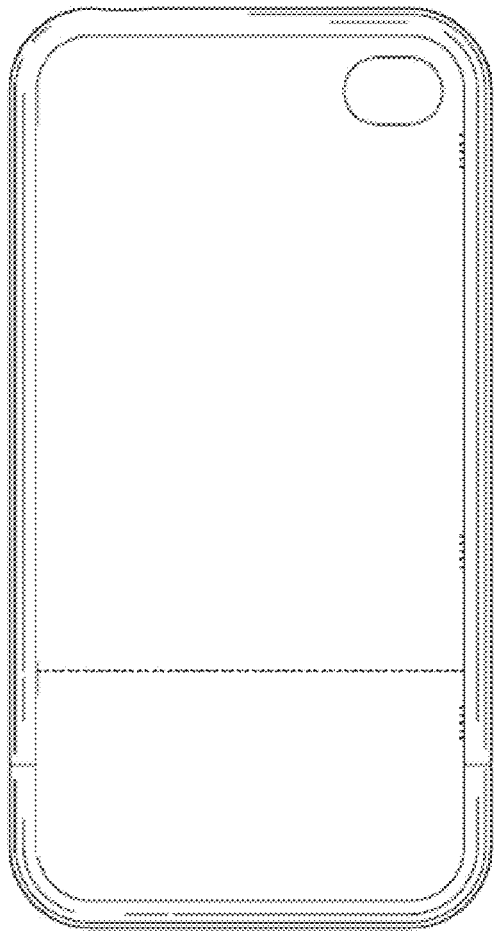
FIG. 8C shows a front of the case without any protective strips or coverings.

FIG. 8C shows a front view of a third embodiment of a case that has no protective strips or coverings. Omitting such protective features can lower the cost of the case. Some users may prefer that the protective features be omitted so that the price of a case will be less.

FIGS. 8A-B show some specific protection mechanisms applied to the case to protect the electronic device against damage. Other types of protection mechanism that may be used instead of or in addition to the protection mechanisms discussed above include applying or spraying a resilient surface treatment or coating to the case (e.g., a rubber or silicon surface treatment), applying or gluing cushioning bumps or numbs (e.g., hemi-spherically shaped dots) to the case, applying cushioning pads or strips (e.g., self-stick felt pads or self-stick rubber bumps), and the like.

In another implementation, the entire interior base surface (or a majority of the base surface area) may be covered with the strip material.

FIGS. 9-10 show side views of the case in the assembled position. Specifically, FIG. 9 shows a left-hand side view of the case. FIG. 10 shows a right-hand side view of the case. As discussed above, seam 601 (FIG. 6A) runs around the case, i.e., around the sides and back of the case. In this specific implementation, side seams 901a and 901b are straight. The side seam is perpendicular to a front and back of the case. In another specific implementation, a side seam is angled or sloped. The side seam is oblique to the front and back of the case. The side seam can have any profile or pattern as discussed above (e.g., wavy, curved, stepped, sawtoothed, and so forth). One side seam (e.g., 901a) may be different from another side seam (e.g., 901b). For example, side seam 901a may be straight and side seam 901b may be sloped.

As shown in FIG. 9, left (or first) sidewall 227 includes side opening 230. In this specific implementation, the side opening provides access to volume and ringer controls or buttons of the smartphone. In this specific implementation, the side opening is uncovered so that the user's finger can pass through the side opening and physically touch at least one of the volume and ringer controls of the smartphone.

In another specific implementation, a cover covers or at least partially covers the side opening. The cover may be, for example, a flexible material such as a rubber. The cover can help to protect the buttons of the smartphone from damage and debris, but the buttons are still accessible because the cover can flex when the user pushes the cover which in turn pushes the controls (e.g., depress volume up button by pressing on cover or depress volume down button by pressing on cover).

In this specific implementation, the side opening is a single side opening providing access to two or more features of the smartphone (i.e., volume and ringer). In another specific implementation, there are first and second side openings, i.e., two or more side openings. In this specific implementation, the first side opening is uncovered and provides access to the ringer. The second side opening is covered and provides access to the volume buttons. In other implementations, both the first and second side openings are covered. Both the first and second side openings are uncovered. The first side opening is covered and the second side opening is uncovered.

Figures 11, 12:
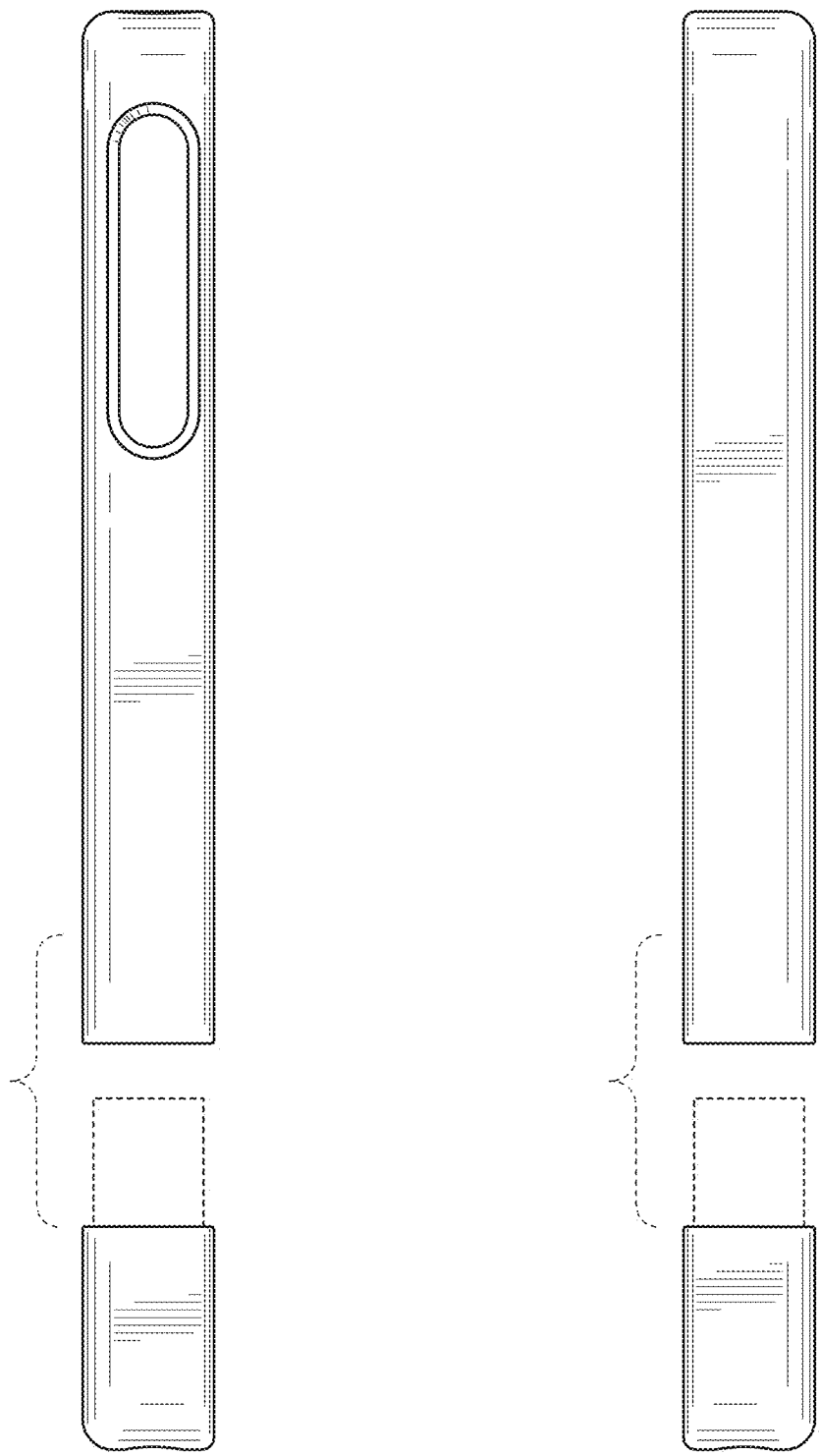
FIG. 11 shows a left side view of the disassembled case.
FIG. 12 shows a right side view of the disassembled case.
Figure 13:
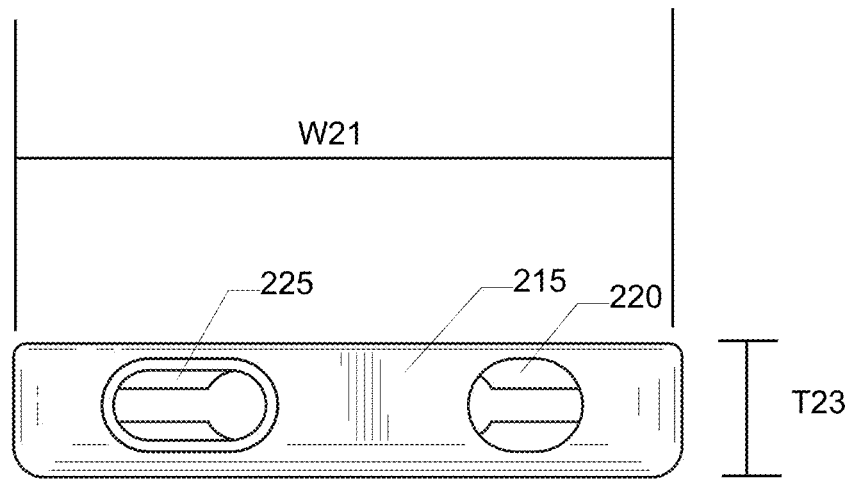
FIG. 13 shows a top side view of the upper case portion of the assembled case.
Figure 14:
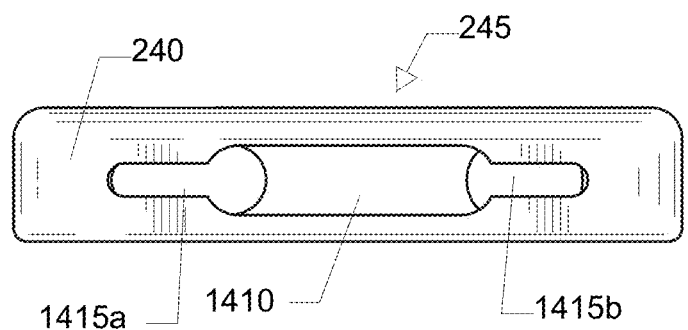
FIG. 14 shows a bottom side view of the lower case portion of the assembled case.

FIGS. 11-12 show side views of the case in the disassembled position. FIGS. 13-14 show end views of the case. Specifically, FIG. 13 shows a top view of the case. Upper sidewall 215 of the upper case portion includes headset jack opening 220 and sleep/wake button opening 225. A width W21 indicates a width of the case. A thickness T23 indicates a thickness of the case.

In a specific implementation, the headset jack opening provides access to a single headset jack of the electronic device. In another specific implementation, the headset jack opening provides access to two headset jacks of the electronic device. The two headset jacks can allow two users to share a single electronic device. In this specific implementation, the headset jack opening may be larger than the headset jack opening shown in FIG. 13 (e.g., have a greater length than the length of jack opening 220) to provide access to the two headset jacks. In another specific implementation, there are first and second headset jack openings, i.e., two separate openings. The first headset jack opening provides access to the first headset jack of the electronic device. The second headset jack opening provides access to the second headset jack of the electronic device.

As discussed above, the dimensions of the case may vary depending upon the specific type of phone that the case is designed to protect. In a specific implementation, width W21 is about 62.2 millimeters, but can range from about 30 millimeters to about 90 millimeters. This includes, for example, 40, 50, 55, 56, 57, 58, 59, 60, 61, 62, 63, 64, 65, 66, 67, 68, 69, 70, 75, 80, 89.9 millimeters, or more than 90 millimeters. Width W21 may be less than 30 millimeters.

In a specific implementation, thickness T23 is about 12.4 millimeters, but can range from about 5 millimeters to about 25 millimeters. This includes, for example, 7, 8, 9, 10, 11, 12, 13, 14, 15, 16, 17, 18, 19, 20, 22, 24.9 millimeters, or more than 25 millimeters. Thickness T23 may be less than 5 millimeters.

FIG. 14 shows a bottom view of the case. Lower sidewall 240 of the lower case portion includes bottom opening 245. In this specific implementation, the bottom opening provides access to, for example, a 30-pin connector and keeps the speaker-microphone holes of the electronic device open. In this specific implementation, a shape of the bottom opening includes a center elongated oval 1410 with each end of the elongated oval having an ear 1415a and 1415b. The specific shape of the bottom may vary from what is shown in the figure. For example, in another specific implementation, the shape is a single rectangle that extends about the same length as bottom opening 245 while, a width is about a width of center elongated oval 1410. The bottom rectangle can have rounded or sharp corners.

In another implementation, instead of a single bottom opening 245, there may be two or more bottom openings such as first bottom opening and a second bottom opening. The first bottom opening can provide access to the pin connector while the second bottom opening can provide access to one speaker-microphone opening. In the case where the electronic device has two speaker-microphone openings, there can be third bottom opening.

The case shown has specific openings sized, shaped, and positioned at particular locations. These openings are customized for smartphone 305 as described above and shown in FIG. 3. It should be appreciated that there may be any number of openings in the upper and lower portions of the case to allow features of a portable electronic device to be accessible to a user. There may be more or fewer openings than that shown in the specific implementation in the figures. For example, a larger opening can be used to replace multiple smaller openings. And a single large opening may be replaced with multiple smaller openings. Compare, for example, the case implementations in FIG. 9 and FIG. 15.

For example, FIG. 6H shows an implementation of a case having two back openings, where one opening is for a flash and one opening is for a camera lens. In other implementations, the back of a case can have three, four, five, six, seven, or more than seven back openings. The openings will be positioned to accommodate features of the electronic device, and a distance separating these openings can vary.

For example, in an implementation, the device has two openings, such as the opening shown in FIG. 6D, on either corner of the device. The openings are symmetrically laid or positioned. These openings will accommodate a device having two camera openings, such as a portable electronic device allowing the capture of stereoscopic pictures, stereoscopic video, three-dimensional pictures, or three-dimensional video, and combinations of these.

The openings may have any size, any shape, any combination of sizes, or any combination of shapes. There can be more, fewer, or different openings from those shown for the case in the figures. The openings can be positioned at different locations than that shown. Other views of a specific implementation of the case are shown in U.S. patent application Ser. No. 29/363,974, filed Jun. 16, 2010, which is incorporated by reference.

Figure 15:
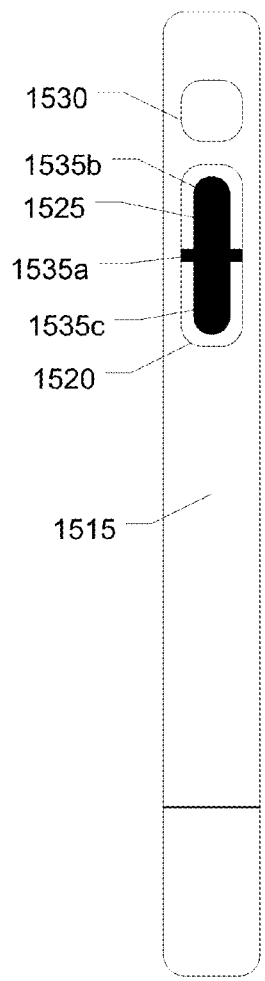
FIG. 15 shows a side view of a case and a first embodiment of a cover covering an opening of the case.

FIGS. 15-18 show a specific implementation of a case where one or more case openings are covered or at least partially covered by a cover. That is, the cover overlaps or at least partially overlaps an opening. FIG. 15 shows a side view of a case 1510 having a sidewall 1515 with two side openings: a first side opening 1520 covered by a cover 1525; and a second side opening 1530 that is uncovered. The cover may be referred to as a button or control cover, a button or control protector, an opening cover, or a protective cover.

In this specific implementation, the cover includes a mounting tab 1535a, and first and second projecting tabs 1535b and 1535c, respectively, extending from the mounting tab. The mounting tab is positioned at about a midpoint of the length of the first side opening, spans widthwise across the first side opening, and helps secure the cover to the first side opening. The mounting tab can be positioned anywhere along the length of the first side opening.

An end of a projecting tab is connected to the mounting tab and an opposite end of the projecting tab is unconnected or unsupported. This allows the projecting tab to act as a cantilever. The projecting tab can flex when pushed which allows the user to access a control of the electronic device even though the control is covered by the cover (i.e., covered by the projecting tab). In other words, the user can press the projecting tab which in turn causes the projecting tab to flex or bend towards the electronic device to depress the control.

In this specific implementation, the first projecting tab covers a volume up button of the electronic device and the second projecting tab covers a volume down button. However, the tabs can cover or make accessible other features or push-button features of the electronic device.

Covering an opening with a cover can help to protect the electronic device from debris by blocking foreign material such as dust, lint, dirt, fluids, liquids (e.g., finger oils) that would otherwise pass through the opening and to the controls of the electronic device. However, because the cover is designed to be flexible, the controls (e.g., push-buttons) of the electronic device can still be accessed.

The projecting tab may be made of any material, but is typically made of a material that is capable of being flexed without breaking. The projecting tab may be made of rubber, plastic, silicon, or any other resilient material.

Figure 16:
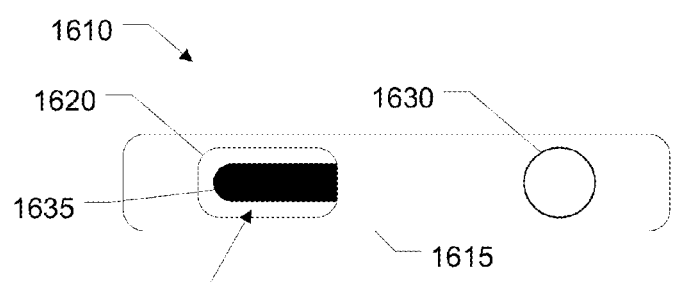
FIG. 16 shows a top view of a case and a second embodiment of a cover covering an opening of the case.

FIG. 16 shows a top view of case 1610 having a top side wall 1615 with two top openings: a first top opening 1620 covered by a cover 1625; and a second top opening 1630 that is uncovered.

Cover 1625 is similar to the cover described above and shown in FIG. 15. However, cover 1625 includes a single projecting tab 1635. An end of the tab is connected to a side of the first top opening nearest the second top opening. The tab extends from the side to an opposite side of the first top opening. An opposite end of the tab is unconnected or is unsupported so that the tab can flex when pressed which in turn depresses the control of the electronic device covered by the tab.

Although FIG. 16 shows the tab connected to a particular side of the first top opening, it should be appreciated that the tab can be connected to any side of the first top opening. For example, the tab may be connected to a top or bottom side of the first top opening. The tab may be connected to a side of the first top opening furthest from the second top opening.

In this specific implementation, the tab covers a wake/sleep button of the electronic device, but can be made to cover to make accessible other features or push-button features of the electronic device.

In a specific implementation, the covers shown in FIGS. 15-16 are flush or are nearly flush with the exterior surface of the case. Making the cover flush with the case can help to prevent the cover from becoming snagged.

Figure 17:
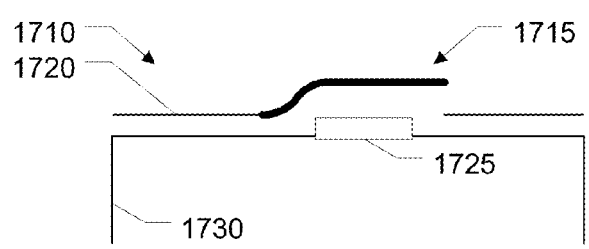
FIG. 17 shows a side view of a case and a third embodiment of a cover covering an opening of the case.

However, in another implementation, the cover projects away from the case. For example, FIG. 17 shows a side view of a case 1710 having a cover 1715 that is raised above a surface 1720 of the case. As described above, the cover can flex like a spring or living hinge so that a control 1725 of electronic device 1730 can be accessed. A raised or projecting cover can help the cover (and thus control 1725) be located tactically. That is, the user can feel along the side of the case for the raised cover. This can be helpful in situations where the user is not able to visually see the case. For example, the case may be in the user's pocket or the user may be driving. Thus, for example, if the user is in a meeting and receives a phone call, the user can locate tactically a mute button of the electronic device via a raised cover that covers the mute button, and without having to look at the case, turn the ringer off. The user does not have to further interrupt the meeting by pulling the case out of the pocket and then looking for the mute button.

Figure 18:
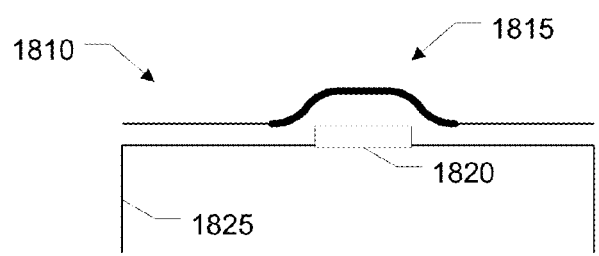
FIG. 18 shows a side view of a case and a fourth embodiment of a cover covering an opening of the case.

FIG. 18 shows a side view of a case 1810 having a cover 1815 that completely covers a control 1820 of a portable electronic device 1825. In this specific implementation, the cover forms a dome shape above the control. As discussed above, the cover may be made of a flexible, resilient material (e.g., thin plastic, rubber, or silicon) so that the dome-shaped cover can be pressed which in turn presses the control of the electronic device. Upon releasing pressure on the cover, the cover will pop-up and thus allow the control to pop-up.

In this specific implementation, the cover is shown raised above a surface of the case. However, in another implementation, a cover may be flush with the case surface. A cover may be below the case surface (e.g., inverted dome-shaped cover). A case can have any combination of the cover types shown in FIGS. 15-18.

In a specific implementation, the cover is designed to be inserted by the user. For example, if the user desires additional protection for the case, the user can purchase a cover for an opening of the case and snap the cover into the case opening. The cover may be designed to be removable by the user. Thus, if the user desires not to use the cover, the user can remove the cover from the case. The button or control cover is designed to be replaceable by the user. When the cover wears out, such as via repeatedly pressing the button cover, the user can remove the button cover from the case opening, dispose the removed and worn button cover, and replace the removed button cover with a new button cover. The button cover can help to protect the electronic device or the button of the electronic device from wear and tear such as via the oils of the user's finger or dust and lint collecting around the button. For a user, replacing the button cover will be much less expensive than having to replace the button of the electronic device.

The button cover may be made of a first type of material and the case may be made of a second type of material, different from the first type. For example, the cover may be made of a flexible material such as rubber while the case is made of a rigid material such as rigid plastic.

In another implementation, the button cover is designed to not be replaceable by the user. For example, the button cover may be secured or bonded to the case via an adhesive (e.g., glue or epoxy). The button cover may be molded together with the case so that the button cover and case form a single integrated unit. Thus, the button cover and case may be made of the same type of material.

In a specific implementation, the case (or case material) includes or is made of polycarbonate. The polycarbonate material may be printable or etchable so that images can be made visible on the case as discussed above. The case may be made of suitable material such as plastic, nylon, metal (e.g., stainless steel, platinum, or aluminum), wood, or combinations of these. In an implementation, the material of the case is a rigid hard plastic. Both upper and lower case portions are made of the same material. The upper case portion is formed of a shape to fit over the phone and lower case portions without need to stretch the upper case portion over the lower case portion. The case portions made of a relatively rigid material cannot be stretched as much as, for example, gel, silicone, or rubber, without cracking or breaking.

In a specific implementation, the case material is hard or rigid plastic or a nonelastomeric material such as a polycarbonate (e.g., Bayer PC2405 or Makrolon® by Bayer Material Science LLC). The case material can be a plastic such as a high density polyethylene, low density polyethylene, thermoplastic, amorphous thermoplastic, or other resin or polymer.

Some examples of thermoplastics includes acrylonitrile butadiene styrene (ABS), acrylic, celluloid, cellulose acetate, ethylene-vinyl acetate (EVA), ethylene vinyl alcohol (EVOH), fluoroplastics, ionomers, Kydex®, liquid crystal polymer (LCP), polyacetal (POM or acetal), polyacrylates (acrylic), polyacrylonitrile (PAN or acrylonitrile), polyamide (PA or nylon), polyamide-imide (PAI), polyaryletherketone (PAEK or ketone), polybutadiene (PBD), polybutylene (PB), polybutylene terephthalate (PBT), polycaprolactone (PCL), polychlorotrifluoroethylene (PCTFE), polyethylene terephthalate (PET), polycyclohexylene dimethylene terephthalate (PCT), polyhydroxyalkanoates (PHAs), polyketone (PK), polyester, polyethylene (PE), polyetheretherketone (PEEK), polyetherketoneketone (PEKK), polyetherimide (PEI), polyethersulfone (PES), polysulfone, polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polytrimethylene terephthalate (PTT), polyurethane (PU), polyvinyl acetate (PVA), polyvinyl chloride (PVC), polyvinylidene chloride (PVDC), and styrene-acrylonitrile (SAN).

A soft-touch or rubberized coating may be applied to the case surface to help improve a user's grip on the case. The soft-touch coating can make the case surface tacky or slightly tacky. In an implementation, both upper and lower case portions are made from the same material. However, in other implementations, the upper and lower case portions may be made of different types of materials (e.g., different types of plastics). In other implementations, the case material may be (or include), rather than a hard or rigid plastic, a compliant or rubber-like material such as a gel, elastomeric, silicone, or rubber. In other implementations, fabric or other materials may be bonded, fused, or otherwised adhered to a surface the case. Such materials may have a decorative patterns.

When a hard plastic is used, some portions of the case can be polished to have a high gloss finish (e.g., similar to a glossy black piano), while other portions will have the soft-touch coating (which is a matte finish). In other implementations, all surfaces can have a high gloss finish. Or, all surfaces can be coated with the soft-touch coating.

The high gloss finish can be obtained or achieved by polishing, sanding, rubbing, or buffing the surface with a relatively fine grit material (e.g., sandpaper, polishing cloth, or paste). One can polish the plastic with successively finer grit materials until the desired finish is obtained. Polishing can be performed using a buffing machine, such as a rotary buffing machine or other buffing machine.

The soft-touch coating can be applied by, for example, spraying, brushing, or painting an appropriate coating on the desired surfaces. In a specific implementation, the coating has a thickness of about 0.1 millimeters. But the thickness of the coating can vary, for example, due to manufacturing variations. In other implementations, for example, the thickness can be from about 0.05 millimeters to about 0.3 millimeters. In further implementations, the coating can be less than 0.05 millimeters or greater than 0.3 millimeters. Generally, the surfaces where the soft-touch coating will be applied do not need to be polished before the coating is applied. However, it may be desirable to buff slightly before applying the coating to ensure the surface is smooth (but not necessarily a high gloss finish) before applying the coating.

In other implementations, the case can be a material or include materials other than plastic. Some examples of case materials include metal (e.g., stainless steel or titanium), glass, transparent or translucent plastic, sapphire, diamond, leather, vinyl, quartz, granite, cloth, fabric, and many others. In a specific implementation, the interior back surface of the case may include a reflective material so that the case can be used as a pocket mirror. The user can remove the electronic device from the case, look at the interior back surface of the case and see their reflection. This allows the user to, for example, apply make-up, adjust their hair, and the like. The mirror can also be used in emergency situations to signal aircraft, boats, or other searchers to alert rescuers to the user's location. The user can aim the mirror's reflection towards rescuers.

In a specific implementation, the case does not include a battery or other electrical components. In another implementation, the case includes a battery. A case having a battery for a portable electronic device is discussed in U.S. Pat. No. 7,612,997, issued Nov. 3, 2009, and U.S. patent application Ser. No. 12/580,977, filed Oct. 16, 2009, which are incorporated by reference.

In a specific implementation, a case includes a stand (e.g., built-in stand), textures for grip, perforations to dissipate heat, a holding strap, glare reducing surface, or combinations of these. These features and others are discussed in U.S. provisional patent application 61/365,302, filed Jul. 16, 2010, which is incorporated by reference.

In a specific implementation, a case for an electronic device includes a first case portion including a first base surface upon which a back of a housing of the electronic device will be placed against, where the base surface comprises a top edge, a lower sidewall, connected to the first base surface at an end opposite of the top edge, that will be positioned against a bottom side edge of the electronic device. A second case portion includes an upper sidewall that will be positioned against a top side edge of the electronic device when the second case portion is seated against the first case portion, and an open side end, opposite the upper sidewall, where the second case portion slides onto the first case portion through the open side end.

When the second case portion is seated against the first case portion, the first and second case portions meet at and form a seam which extends across a back of the case, and a back opening, through the back of the case, including a first length of at least about 13 millimeters.

When the second case portion is seated against the first case portion, a first open-shaped opening for the first case portion merges with a second open-shaped opening for the second case portion to form a front opening of the case through which a screen of the electronic device will be visible, the front opening having a closed shape, and the back opening has a closed shape through which a camera flash and camera lens of the electronic device will be visible.

The case may include two seam lines visible from front of case, that are on either side of a bottom edge of a screen of the device. The case may include two seam lines visible from the front of case, that are on either side of a screen of the device.

A seam line may be between the bottom edge of the screen and a bottom half of the screen. A seam line may be between the bottom edge of the screen and a top half of the screen. A seam line may be anywhere between the bottom edge of the screen and the top edge of the screen.

In a specific implementation, a side seam edge is sloped, i.e., not straight. In another specific implementation, a side seam edge is perpendicular or straight. A back seam edge can be straight, curved, or have any desired pattern. Top and bottom case halves or portions may be different colors. In a specific implementation, a picture on the top case portion joins with a picture on a bottom case portion to complete a picture.

In a specific implementation, the case is customizable. A method includes printing or customizing pictures on back (or other places of case), such as by laser etching. A user can send in a photograph of her daughter, and then the manufacturer will send back a case that has this photograph printed on the back of the case.

In a specific implementation, the back opening has an oval shape, having a second length, less than the first length, of at least about 4 millimeters. In another specific implementation, the difference is at least about 6 millimeters.

In a specific implementation, the back opening or oval on the back of the case is on the lower case portion. In another specific implementation, the back opening or oval is on the upper case portion. The sidewall edges and back of the case may be straight. In an implementation, the case further includes button holes. One or more of these button holes or openings may be at least partially covered, i.e., a covered opening. A case may have a single opening to provide access to two or more features of the electronic device. A case may have multiple openings, each opening providing access to at least one feature of the electronic device. A bottom opening of the case may be straight across like a rectangle.

In a specific implementation, the case material is polycarbonate. The case material may be printable or etchable.

In a specific implementation, a case includes a first back opening and a second back opening, through the back of the case. Each back opening includes a length of at least about 5 millimeters. The first back opening may be about 9 millimeters. The second back opening may be about 5 millimeters. A difference between lengths of the first and second back opening may be about 4 millimeters.

In a specific implementation, a case for an electronic device includes a first case portion including a first base surface upon which a back of a housing of the electronic device will be placed against, where the base surface comprises a top edge, a lower sidewall, connected to the first base surface at an end opposite of the top edge, that will be positioned against a bottom side edge of the electronic device. A second case portion includes an upper sidewall that will be positioned against a top side edge of the electronic device when the second case portion is seated against the first case portion, and an open side end, opposite the upper sidewall, where the second case portion slides onto the first case portion through the open side end.

When the second case portion is seated against the first case portion, the first and second case portions meet at and form a seam which extends across a back of the case, and a back opening, through the back of the case, having a shape of an oval and including a length and a width, where the length is greater than the width.

When the second case portion is seated against the first case portion, a first open-shaped opening for the first case portion merges with a second open-shaped opening for the second case portion to form a front opening of the case through which a screen of the electronic device will be visible, the front opening having a closed shape, and the back opening has a closed shape through which a camera flash and camera lens of the electronic device will be visible.

In a specific implementation, a case for an electronic device includes a first case portion including a first base surface upon which a back of a housing of the electronic device will be placed against, where the base surface comprises a top edge, a lower sidewall, connected to the first base surface at an end opposite of the top edge, that will be positioned against a bottom side edge of the electronic device. A second case portion includes an upper sidewall that will be positioned against a top side edge of the electronic device when the second case portion is seated against the first case portion, and an open side end, opposite the upper sidewall, where the second case portion slides onto the first case portion through the open side end.

When the second case portion is seated against the first case portion, the first and second case portions meet at and form a seam which extends across a back of the case, and a back opening, through the back of the case, having a shape of an oval and including a length and a width, where the length is greater than the width.

When the second case portion is seated against the first case portion, a first open-shaped opening for the first case portion merges with a second open-shaped opening for the second case portion to form a front opening of the case through which a screen of the electronic device will be visible, the front opening having a closed shape, and the back opening has a closed shape through which a camera flash and camera lens of the electronic device will be visible. And there are seam edges on either side of the front opening, and the sidewall edges are straight.

A case may include two independent openings. An opening may be egg-shaped. A case may be opaque, transparent, or both. For example, upper case portion may be transparent and a lower case portion may be opaque.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A case for an electronic device comprising:
    a first case portion comprising:
    a first back sidewall, wherein the first back sidewall comprises a top edge; and
    a lower sidewall, connected to the first back sidewall at an end opposite of the top edge, that will be positioned against a bottom side edge of the electronic device;
    a second case portion comprising:
    an upper sidewall that will be positioned against a top side edge of the electronic device when the second case portion is seated against the first case portion; and
    an open side end, opposite the upper sidewall, wherein the second case portion slides onto the first case portion through the open side end; and
    a back opening, through a back of the case, comprising a length and a width, wherein the length of the back opening is greater than the width of the back opening, an inner surface of the back opening has a height at least a thickness of the back of the case from an interior side to an exterior side of the back of the case, and the inner surface is colored in a black color, whereby the black color helps reduce glare from a flash to a camera of the electronic device,
    wherein the back opening is placed against a back of the electronic device and the opening has sufficient length so that a flash and camera lens on the back of the electronic device are both exposed by a single back opening,
    the inner surface, colored in the black color, of the back opening forms a loop around both the flash and camera lens,
    when the second case portion is seated against the first case portion, the first and second case portions meet at and form a seam which extends across the back of the case, and
    when the second case portion is seated against the first case portion, a first open-shaped opening for the first case portion merges with a second open-shaped opening for the second case portion to form a front opening of the case through which a screen of the electronic device will be visible, the front opening having a closed shape.

2. The case of claim 1 wherein the length of the back opening is at least about 13 millimeters.

3. The case of claim 1 wherein first and second seam lines of the seam are visible from a front of the case, the first seam line being on one side of the front opening, and the second seam line being on an opposite side of the front opening.

4. The case of claim 3 wherein the first seam line is at one end of a bottom edge of the screen and the second seam line is at an opposite end of the bottom edge of the screen.

5. The case of claim 1 wherein the first case portion comprises the back opening.

6. The case of claim 1 wherein the second case portion comprises the back opening.

7. The case of claim 1 wherein a distance from the seam to the back opening is greater than a distance from the seam to the lower sidewall.

8. The case of claim 1 wherein a distance from the seam to the back opening is less than a distance from the seam to the lower sidewall.

9. The case of claim 1 wherein a first seam line of the seam extending across the back of the case is straight.

10. The case of claim 1 wherein a first seam line of the seam extending across the back of the case is curved.

11. The case of claim 1 wherein a shape of the back opening is an oval having the length and the width, wherein a difference between the length and the width is at least about 4 millimeters.

12. The case of claim 1 wherein the ring's length and width increase in a direction from the interior side to the exterior side of the back of the case.

13. The case of claim 1 comprising a bottom opening through the lower sidewall, wherein a shape of the bottom opening is a rectangle.

14. The case of claim 1 wherein a color of the second case portion, other than at the inner surface of the back opening, is a color other than the black color.

15. The case of claim 1 wherein a color of the first case portion is a color other than the black color of the inner surface.

16. The case of claim 1 wherein the back opening has an obround shape.

17. The case of claim 1 wherein the back opening has an egg shape.

18. The case of claim 1 wherein the back opening has a keyhole shape.

19. The case of claim 1 wherein the case is for a smartphone device.

20. The case of claim 1 wherein the case comprises a battery.

21. The case of claim 1 wherein the back of the case comprises a base layer comprising an interior side and an exterior side, the back opening is formed in the base layer and extends from the interior side to the exterior side of the base layer, the back opening comprising a minimum length longer than its minimum width; and a ring having the black color, coupled in the back opening, comprising inner and outer perimeters, wherein the inner perimeter comprises an inner length greater than an inner width, the outer perimeter comprises an outer length greater than an outer width, the inner width is less than the outer width, and the inner length is less than the outer length, the ring's width is aligned with the opening's width, and the ring's length is aligned with the opening's length, at least a portion of the ring's outer length is greater than the opening's minimum length, and at least a portion of the ring's outer width is greater than the opening's minimum width, at least a portion of a ring's outer width is less than or equal to the opening's minimum width, and at least a portion of a ring's outer length is less than or equal to the opening's minimum length.

22. The case of claim 21 wherein the ring's inner width varies, increasing in a direction from the interior side to the exterior side of the base layer, and the ring's inner length varies, increasing in a direction from the interior side to the exterior side of the base layer.

* * * * *